(12) United States Patent
Young

(10) Patent No.: US 6,396,303 B1
(45) Date of Patent: May 28, 2002

(54) EXPANDABLE INTERCONNECT STRUCTURE FOR FPGAS

(75) Inventor: Steven P. Young, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/361,790

(22) Filed: Jul. 27, 1999

Related U.S. Application Data

(63) Continuation-in-part of application No. 08/821,263, filed on Mar. 20, 1997, now Pat. No. 5,942,913, which is a continuation-in-part of application No. 08/806,997, filed on Feb. 26, 1997, now Pat. No. 5,914,616.

(51) Int. Cl.$^7$ .......................................... H03K 19/177
(52) U.S. Cl. .......................................... 326/39; 326/41
(58) Field of Search ....................................... 326/39, 41

(56) References Cited

U.S. PATENT DOCUMENTS

| | | | |
|---|---|---|---|
| 4,642,487 A | | 2/1987 | Carter ......................... 307/465 |
| 5,073,729 A | | 12/1991 | Greene et al. ............ 307/465.1 |
| RE34,363 E | | 8/1993 | Freeman ...................... 307/465 |
| 5,469,003 A | | 11/1995 | Kean ............................ 326/39 |
| 5,581,199 A | | 12/1996 | Pierce et al. ................... 326/41 |
| 5,629,886 A | | 5/1997 | New ............................ 364/787 |
| 5,677,638 A | | 10/1997 | Young et al. .................. 326/39 |
| 5,682,107 A | * | 10/1997 | Tavana et al. ................. 326/39 |
| 5,787,007 A | * | 7/1998 | Bauer ........................... 326/39 |
| 5,828,230 A | | 10/1998 | Young .......................... 326/41 |
| 5,847,580 A | | 12/1998 | Bapat et al. ................... 326/82 |
| 5,889,413 A | | 3/1999 | Bauer ........................... 326/40 |
| 5,907,248 A | * | 5/1999 | Bauer et al. ................... 326/39 |
| 5,914,616 A | * | 6/1999 | Young et al. .................. 326/41 |
| 5,933,023 A | * | 8/1999 | Young .......................... 326/41 |
| 5,942,913 A | * | 8/1999 | Young et al. .................. 326/41 |
| 5,963,050 A | * | 10/1999 | Young et al. .................. 326/41 |
| 6,011,407 A | * | 1/2000 | New ............................ 326/39 |
| 6,107,827 A | * | 8/2000 | Young et al. .................. 326/41 |
| 6,204,689 B1 | * | 3/2001 | Percey et al. .................. 326/41 |

OTHER PUBLICATIONS

"The Programmable Logic Data Book", 1996, available from Xilinx Inc., 2100 Logic Drive, San Jose, California, 95124, pp. 4–11 to 4–23, 4–32 to 4–37, 4–294, 4–295, 13–13 to 13–15, 4–188 to 4–190.

\* cited by examiner

*Primary Examiner*—Thong Phan
(74) *Attorney, Agent, or Firm*—E. Eric Hoffman; Lois D. Cartier

(57) ABSTRACT

The programmable interconnect points (PIPS) associated with each tile of an FPGA are programmed in response to configuration data values stored in an array of configuration memory cells. Configuration memory cells that control the configuration of the interconnect structure of the tile are located in a rectangular block within the array. For example, the configuration memory cells that control the configuration of the interconnect structure may be located in several rows of the array. This configuration enables the interconnect structure of the tile to be easily modified. To add more interconnect lines to the FPGA, the additional interconnect lines and their associated PIPs are added to the interconnect structure, and the configuration memory cells required to program the PIPs are added as additional rows in the configuration memory cell array. The pattern of configuration memory cells remains unchanged, except for the added rows of configuration memory cells. As a result, the stream of configuration data values required to program the original FPGA is compatible with the stream of configuration data values required to program the FPGA having the expanded interconnect 'structure.

17 Claims, 21 Drawing Sheets

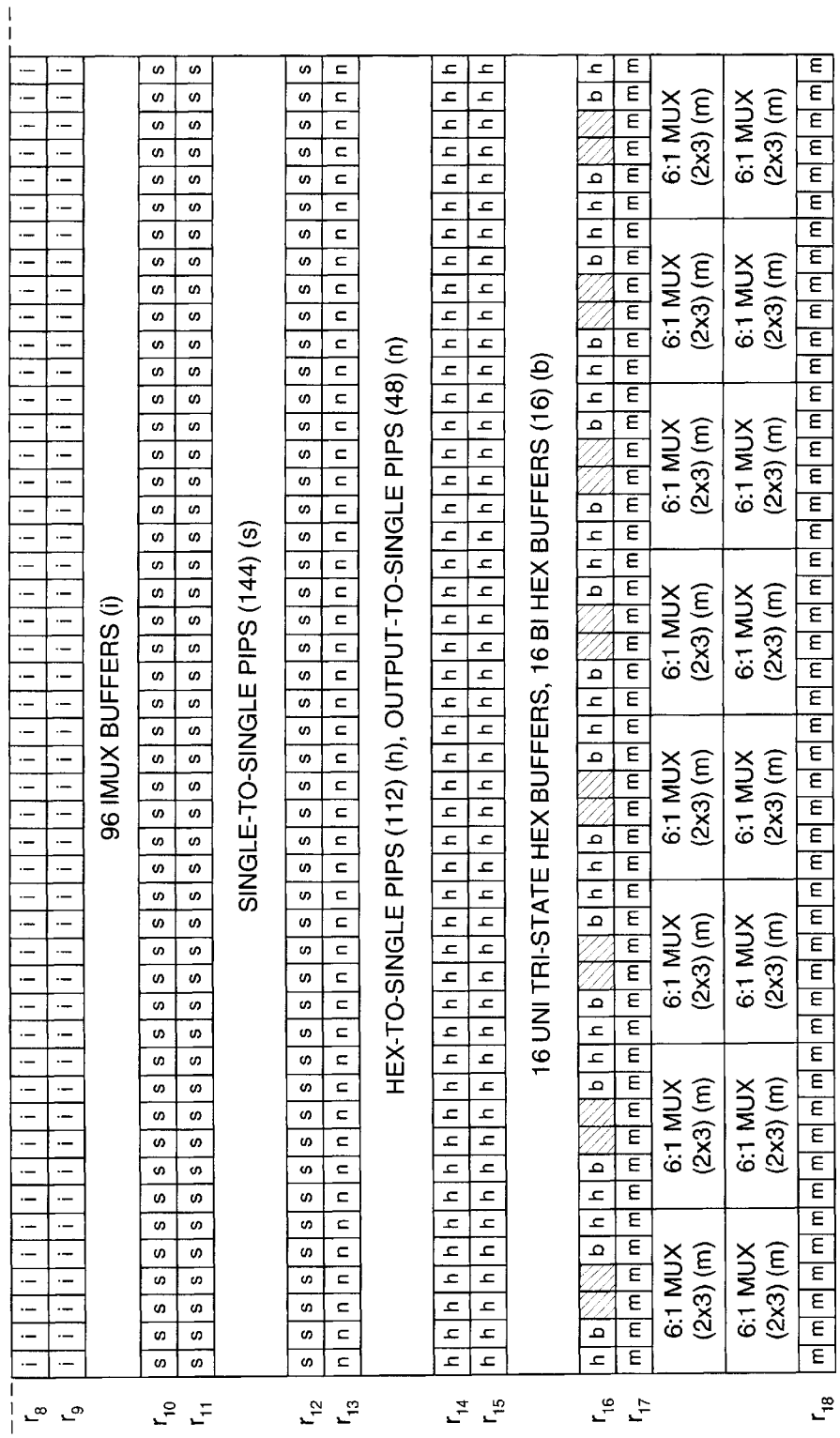

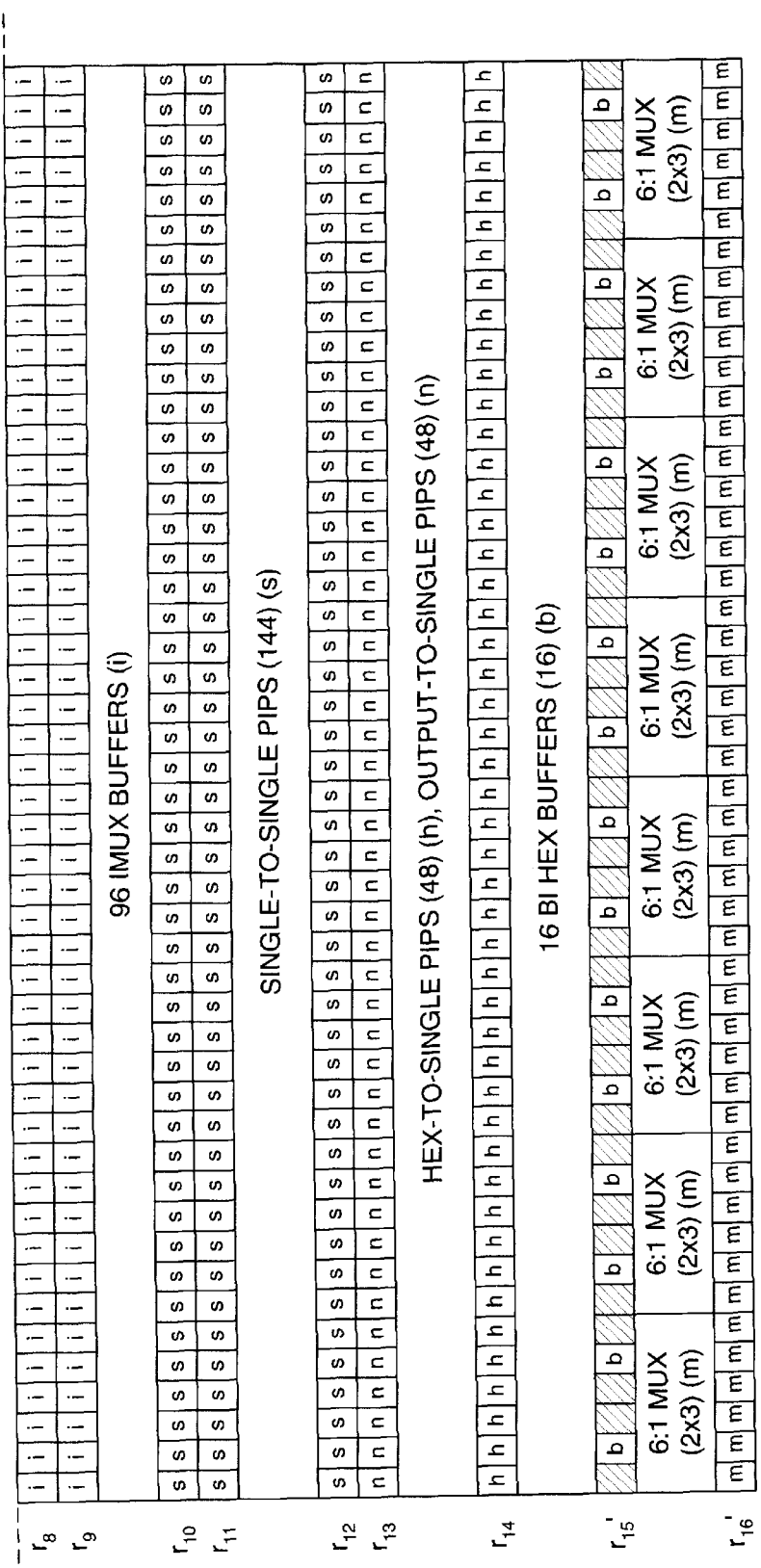

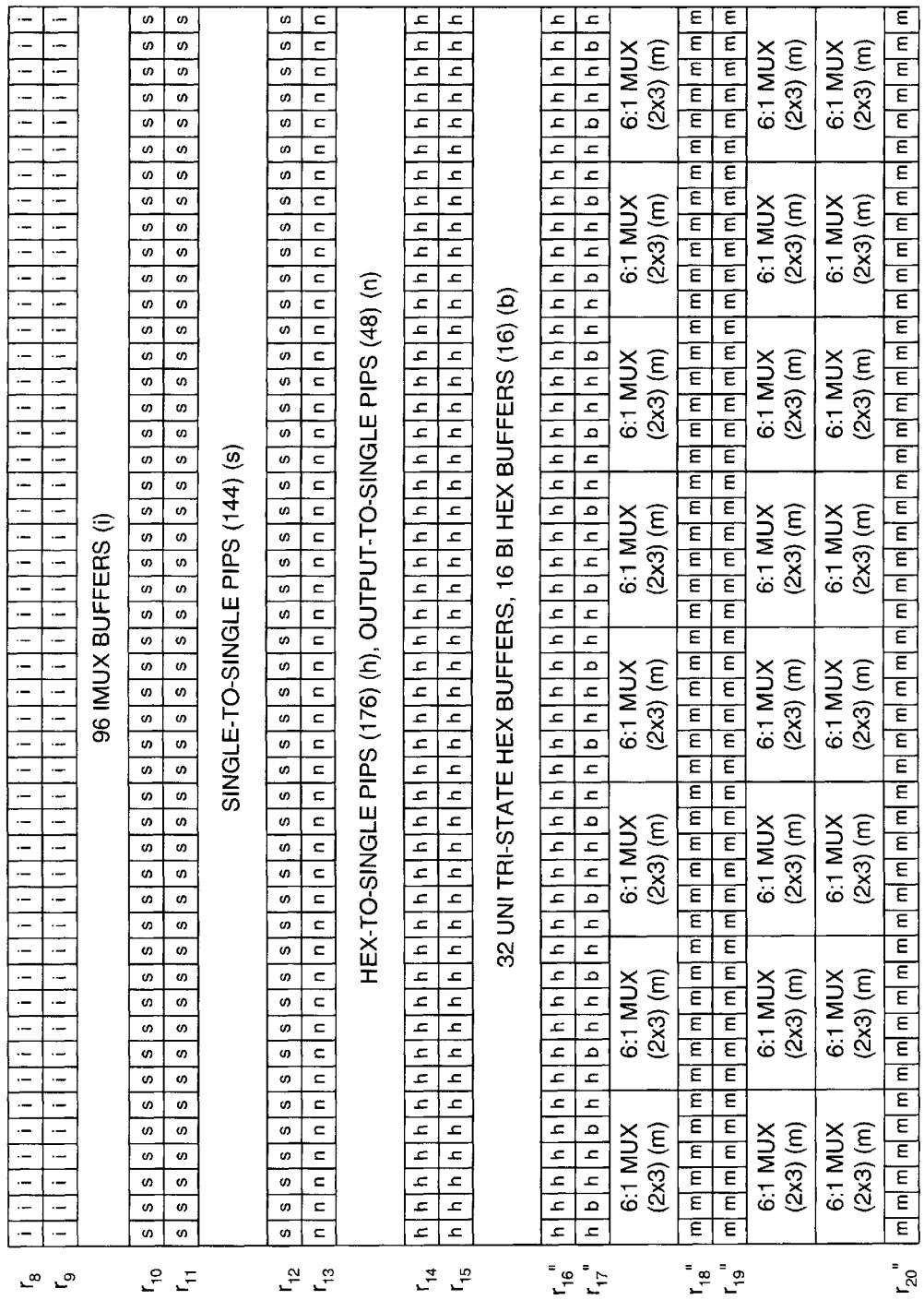

EXPANDABLE INTERCONNECT STRUCTURE FOR FPGAS

CROSS-REFERENCE TO RELATED APPLICATIONS

This application is a continuation-in-part application of commonly assigned co-pending U.S. patent application Ser. No. 08/821,263, invented by Steven P. Young, Trevor J. Bauer, Kamal Chaudhary, and Sridhar Krishnamurthy and filed Mar. 20, 1997; now U.S. Pat. No. 5,942,913 which is a continuation-in-part application of 08/806,997 the commonly assigned co-pending U.S. Patent Application issued Jun. 22, 1999 as U.S. Pat. No. 5,914,616 and filed Feb. 26, 1997 both of which are incorporated herein by reference.

This application further relates to the following commonly assigned co-pending U.S. patent applications:

1. Ser. No. 08/786,818 invented by Kenneth D. Chapman and Steven P. Young, entitled "CONFIGURABLE LOGIC BLOCK WITH AND GATE FOR EFFICIENT MULTIPLICATION IN FPGAs" and filed Jan. 21, 1997,
2. Ser. No. 08/754,421 invented by Trevor J. Bauer, entitled "LOOKUP TABLES WHICH DOUBLE AS SHIFT REGISTERS" and filed Nov. 22, 1996,
3. Ser. No. 09/128,735 invented by Roman Iwanczuk, Steven P. Young, and David P. Schultz, entitled "FRAME-BASED STRUCTURE AND METHOD FOR LOADING CONFIGURATION DATA INTO AN FPGA" and filed Aug. 4, 1998, and
4. Ser. No. 09/102,711 invented by Steven P. Young, entitled "EFFICIENT MULTIPLEXER STRUCTURE FOR USE IN FPGA LOGIC BLOCKS" and filed Jun. 22, 1998, which are also incorporated herein by reference.

BACKGROUND OF THE INVENTION

1. Field of the Invention

The invention relates to programmable integrated circuit devices, more particularly to an expandable interconnect structure in a field programmable logic device.

2. Description of the Background Art

Field programmable gate arrays (FPGAs) include logic blocks connectable through a programmable interconnect structure. The interconnect structure typically provides for connecting each logic block to each other logic block. Early FPGAs accomplished this by providing short interconnect segments that could be joined to each other and to input and output terminals of the logic blocks at programmable interconnection points (PIPs). As these FPGAs become larger and more complex, the interconnect structure must also become both larger and more complex. In order to improve speed (performance), direct connections to adjacent logic blocks have been provided, and for transmitting a signal the distance of many logic blocks, longer lines have been provided. In order to save silicon area, less frequent PIPs have been provided. With fewer PIPs present, the routing is less flexible (for the same number of routing lines), but typically faster due to reduced loading. By removing only those PIPs which are least often used, routing flexibility can be minimally affected. Thus, there is a trade-off between performance, silicon area, number of routing lines, and routing flexibility.

Several U.S. Patents show such structures for interconnecting logic blocks in FPGAs. Freeman in U.S. Reissue Pat. Re No. 34,363 describes the first FPGA interconnect structure, and includes short routing segments and flexible connections as well as global lines for signals such as clock signals. Carter in U.S. Pat. No. 4,642,487 shows the addition of direct connections between adjacent logic blocks to the interconnect structure of Freeman. These direct connections provide fast paths between adjacent logic blocks. Greene et al in U.S. Pat. No. 5,073,729 shows a segmented interconnect structure with routing lines of varied lengths. Kean in U.S. Pat. No. 5,469,003 shows a hierarchical interconnect structure having lines of a short length connectable at boundaries to lines of a longer length extending between the boundaries, and larger boundaries with lines of even longer length extending between those boundaries. Kean shows in particular lines the length of one logic block connecting each logic block to the next, lines the length of four logic blocks connectable to each logic block they pass, and lines the length of sixteen logic blocks connectable at the length-four boundaries to the length-four lines but not connectable directly to the logic blocks. In Kean's architecture, adjacent logic blocks in two different hierarchical blocks (i.e., on either side of the boundaries) connect to each other differently than adjacent logic blocks in the same hierarchical block.

Pierce et al in U.S. Pat. No. 5,581,199 shows a tile-based interconnect structure with lines of varying lengths in which each tile in a rectangular array may be identical to each other tile. In the Pierce et al architecture, an interconnect line is part of the output structure of a logic block. Output lines of more than one length extend past other logic block input lines to which the logic block output lines can be connected. All of the above-referenced patents are incorporated herein by reference, and can be reviewed for more understanding of prior art routing structures in FPGAs.

In the interconnect structures described by Freeman and Greene et al, each path is formed by traversing a series of programmable concatenated interconnect lines, i.e., a series of relatively short interconnect lines are programmably connected end to end to form a longer path. The relatively large number of programmable connections on a given signal path introduces delay into the signal path and therefore reduces the performance of the FPGA. Such interconnect structures are called "general interconnect".

The direct connections first described by Carter and included in the architecture of Kean provide fast paths between adjacent logic blocks, but in Carter's structure general interconnect must still be used to traverse the distance between any two blocks that are not adjacent. Therefore, circuits large enough or complex enough to require interconnecting signals between non-adjacent blocks (which frequently occur) must use the general interconnect to make these connections. For short paths, general interconnect is slower than direct interconnect, because general interconnect must be connected through several PIPs, or, if long lines are used, must be buffered to accommodate long or heavily loaded signals, introducing delay. Additionally, it is inefficient in terms of silicon area to use long lines for short paths that may be traversing only a few logic blocks, since the long lines can otherwise be used for longer paths. Further, since software that implements a logic design in an FPGA typically places interconnected logic in close proximity, structures that take advantage of this placement strategy will work well with the software, resulting in shorter compilation times for routing software and more efficient circuit implementations.

Interconnect lines called "quad lines" are included in the XC4000EX FPGAs from Xilinx, Inc., and described on pages 4-32 through 4-37 of the Xilinx 1996 Data Book entitled "The Programmable Logic Data Book", available from Xilinx, Inc., 2100 Logic Drive, San Jose, Calif. 95124, which are incorporated herein by reference. However, since each quad line contacts every tile that it traverses, these lines have a large number of PIPs, each of which adds RC delay.

Pierce et al provides fast paths between both adjacent logic blocks and logic blocks several tiles apart. The output lines of the Pierce et al architecture can each drive the inputs of a limited set of other logic blocks. However, the possible destinations are limited to selected logic blocks, and the interconnect lines can only access certain specific inputs of the destination logic blocks.

In each of the prior art structures recited above, each interconnect line has programmable connections to the inputs of other logic blocks. However, in the structures of Freeman, Carter, and Pierce et al, a given logic block input can be driven from either horizontal interconnect lines, or vertical interconnect lines, but not both. An alternative approach is to separate the interconnect lines from the logic block inputs by way of a routing matrix, which gives each interconnect line more flexible access to the logic block inputs. Such an architecture is described in U.S. Pat. No. 5,682,107, entitled "FPGA Architecture With Repeatable Tiles Including Routing Matrices and Logic Matrices" by Tavana et al, which is incorporated herein by reference. In the structure of Tavana et al, most interconnect lines entering the tile connect to a routing matrix within the tile, rather than directly to logic block inputs or outputs. Connections between pairs of interconnect lines and between interconnect lines and logic block inputs are made through lines called "tile interconnect lines" that do not leave the tile. The advantage of having an extra interconnect line in a path from the edge of a tile to the logic block in the tile is that the routing matrix is flexible but consumes a relatively small amount of silicon area. A combination of PIPs can allow access from any line entering the tile to any desired input of a destination logic block. Yet the total number of PIPs is smaller than in many other interconnect structures. The disadvantage is that getting on and off the tile interconnect lines inserts a certain amount of delay into the path for each tile traversed. This delay inhibits the fast propagation of signals through the FPGA. Tavana et al have therefore provided long lines connectable to every tile they pass and double-length lines that bypass the tile interconnect lines in one tile. These lines can be used for signals that are traversing one or more tiles without accessing the logic blocks in the traversed tiles.

Kean separates the interconnect lines from the logic block inputs using input multiplexer switches, which provide routing flexibility to the inputs.

Since the slowest signal path between logic blocks typically determines the performance of a circuit, it is advantageous to make the slowest path as fast as possible. One way to accomplish this is to design the interconnect structure such that there is a relatively uniform delay on all signal paths throughout an FPGA. In the above routing structures, a typical distribution of delays on signal paths shows a few signal paths with significantly greater delay than the average. These signal paths are typically those with large "RC trees", i.e., signal paths which traverse a resistor (such as an unbuffered PIP), then have a large capacitance on the destination side of the resistor. An interconnect structure with relatively uniform delay could be better realized if large capacitances on a signal path (e.g., longer interconnect lines) were predictably placed on the source side of the resistor, or as close as possible to the source end of the signal path.

High fanout signals have large capacitance and are often slower than low fanout signals. Prior art routing structures had high-fanout signal routing with relatively large RC delay. An interconnect structure should ideally provide high-fanout signal routing with a delay comparable to that of other signals.

It is therefore desirable to find an interconnect structure that allows: 1) uniformly fast propagation of signals, including high-fanout signals, throughout the FPGA; 2) implementation of localized circuits in non-adjacent as well as adjacent blocks using fast paths; 3) ease of use by software; 4) efficient implementation of commonly used logic functions; and 5) a high degree of routing flexibility per silicon area consumed.

SUMMARY OF THE INVENTION

According to the invention, an FPGA interconnect structure includes a combination of wiring segment lengths and connections to logic blocks such that a given logic block can be connected through fast paths both to adjacent logic blocks and to logic blocks several tiles away. In the preferred mode, the FPGA includes a two-dimensional array of identical tiles. In each tile is a logic block. Also in each tile are programmable interconnection points (PIPs) and segments of interconnect lines that adjoin segments of interconnect lines in adjacent tiles. The adjoined segments form interconnect lines extending through several tiles to PIPs in other tiles some distance away. A combination of lines connecting to adjacent tiles (called single-length lines) and lines at least three tiles long connecting a first tile to at least second and third tiles at least two and three tiles away (called intermediate-length lines) creates an interconnect hierarchy which allows any logic block to be connected to any other logic block, and yet also allows for fast paths both to adjacent tiles and to tiles some distance away. Longer interconnect lines (called long lines) may be included as a third level of hierarchy to permit efficient interconnection of widely separated tiles. Long lines can span the entire width of the tile array, or can be programmably segmented into two or more shorter long lines. In one embodiment, long lines are distinguished from intermediate-length lines in that a pattern of PIPs spanning two or more tiles is repeated along the length of the long line. When the size of the tile array is increased, more instances of the pattern occur. By contrast, intermediate-length lines according to the invention are of a predetermined length that does not alter when the size of the array is increased. When the size of the tile array is increased, additional intermediate-length lines are added.

A unique aspect of the invention is having an interconnect line (specifically an intermediate-length line or a long line) that programmably connects to logic blocks in at least three separate tiles, while extending through at least one tile in which no PIPs connect to the interconnect line. Such an interconnect line is said to be "unconnectable" to the tile in which no PIPs connect to the interconnect line and also "unconnectable" to the logic block in the tile, although connections can be made from the interconnect line to the logic block through PIPs in other tiles. A programmable connection from an interconnect line to a logic block in a given tile may be made: a) directly to a logic block input; b) through one or more PIPs connected to the interconnect line in the same tile; or c) through one or more PIPs connected to the interconnect line in the same tile and through one or more single-length lines. If any such programmable connection from an interconnect line to a logic block in a given tile can be made, the interconnect line is said to be "connectable" to the logic block and to the tile.

In a preferred embodiment, from an originating tile an intermediate-length line connects to the tile three tiles away (i.e., separated by two tiles from the originating tile), then continues and connects to the tile six tiles away (i.e., separated by five tiles from the originating tile). This intermediate-length line (called a "hex line") does not connect to the intervening tiles one, two, four, and five tiles away. Instead, these tiles are reached indirectly by using single-length lines from the originating tile, the third tile, or the sixth tile. Connecting to only three of the seven tiles traversed by the hex line reduces the number of PIPs, and therefore reduces the silicon area required to form the interconnect line (thereby lowering the cost of the FPGA) and also reduces the capacitance added by PIPs (thereby increasing FPGA performance). Yet the combination of this intermediate-length routing, direct connections to neighboring tiles, and long lines to distant tiles allows highly flexible routing of signals.

Many modifications of the interconnect structure of the invention are possible. One such modification is the use of asymmetrical PIP patterns on interconnect lines (intermediate-length lines or long lines) such that the interconnect line connects three logic blocks, with two of the three logic blocks being in adjacent tiles, while the third logic block is in a tile separated from the other two tiles.

As FPGAs grow larger, the amount of routing required per tile grows larger. Therefore, the silicon area required to implement the necessary PIPs tends to grow larger, and the silicon area per tile increases as the number of tiles in an FPGA increases. It is desirable to reduce the number of PIPs required per tile.

In one embodiment, only the single-length lines have connections to the logic block inputs. The intermediate-length lines have connections to each other and to single-length lines, but not to the logic block inputs. The long lines have connections to the intermediate-length lines, but not to the single-length lines or to the logic block inputs. Therefore, the number of PIPs in a tile is reduced. As with the intermediate-length lines, reducing the number of PIPs on a long line reduces both silicon area and capacitance on the long line, thereby reducing RC delay. In some embodiments, special tiles include additional connections between the various interconnect lines to facilitate distribution of high-fanout signals. In some embodiments, global lines having direct access to the logic block inputs are available for global signals such as clocks or other high fanout control signals. In some embodiments, the long lines have connections to each other in the repeatable tile instead of in special tiles.

In some embodiments, the single-length lines are driven by unbuffered PIPs and the intermediate-length and long lines are driven by buffered PIPS. Signals are typically routed on longer buffered interconnect lines first, then fanned out on shorter unbuffered lines. In this manner, large unbuffered RC trees are avoided, making delays on signal paths throughout the FPGA more uniform and improving performance. More uniform delays also make it easier to predict the performance of a circuit earlier in the design cycle.

In accordance with another embodiment of the present invention, the PIPs associated with each tile are programmed in response to configuration data values that are stored in a plurality of configuration memory cells. The configuration memory cells used to configure each tile are arranged in an array having a predetermined number of rows and columns. For example, the configuration memory cell array may include 18 rows and 48 columns of configuration memory cells. The configuration memory cells are preferably laid out adjacent to the elements that they control. For example, configuration memory cells that control the configuration of the logic element are laid out adjacent to the logic element. The configuration memory cells that control the configuration of the interconnect structure are located in rectangular blocks within the array. For example, the configuration memory cells that control the configuration of the interconnect structure may be located in one or more complete rows of the array. This configuration enables the interconnect structure of the tile to be easily modified. For example, to add more interconnect lines to the FPGA, the additional interconnect lines and their associated PIPs are added to the interconnect structure, and the configuration memory cells required to program the new PIPs are added as additional rows in the configuration memory cell array. The pattern of configuration memory cells remains unchanged, except for the added rows of configuration memory cells. The interconnect structure of the tile is therefore easily expandable by adding a rectangular area to the original tile. Moreover, the stream of configuration data values required to program the original FPGA is compatible with the stream of configuration data values required to program the FPGA having the increased interconnect structure.

The compatibility of the configuration bit streams exists because the configuration memory cell array is programmed on a column by column basis. For example, if the original configuration memory cell array has eighteen rows, then eighteen configuration data values are simultaneously loaded into a column of the configuration memory cell array. Similarly, if the expanded configuration memory cell array has twenty rows, then twenty configuration data values are simultaneously loaded into a column of the configuration memory cell array. The streams of configuration data values used to program the eighteen row array and the twenty row array will only differ by the configuration data values associated with the two additional rows in the twenty row array. That is, eighteen configuration data values will match in each of the streams. As a result, the streams of configuration data values of the two tiles are compatible. The stream of configuration data values used to configure the eighteen row array can also be used to configure the twenty row array, as long as "don't program" values are provided at the two additional row locations.

In another example, interconnect lines are removed from the interconnect structure of the FPGA. To accomplish this, the interconnect lines to be eliminated and their associated PIPs are removed from the interconnect structure. In addition, the configuration memory cells required to program these PIPs are removed, by row, from the first edge of the configuration memory cell array. The pattern of configuration memory cells remains unchanged, except for the removed rows of configuration memory cells. As a result, the tile retains most of its original layout characteristics. Moreover, the stream of configuration data values required to program the FPGA having the reduced interconnect structure is compatible with the stream of configuration data values required to program the original FPGA.

In one embodiment, the interconnect structure is increased or decreased by adding or removing a plurality of intermediate length lines and their associated PIPs. However, in other embodiments, other interconnect resources can be added or removed in accordance with the principles of the present invention.

The present invention will be more fully understood in view of the following description and drawings.

BRIEF DESCRIPTION OF THE DRAWINGS

FIG. 1 is a simplified representation of the embodiment of FIG. 2.

DETAILED DESCRIPTION OF THE DRAWINGS

The following drawing conventions are used throughout the figures. A small solid black dot at the intersection of two lines indicates a permanent electrical connection between the crossing lines. An open circle enclosing an intersection between two lines, or separating a single line into two line segments, indicates a programmable bi-directional connection between the lines or line segments (for example, a pass transistor which is turned on to make the connection). An open triangle at an intersection of two lines indicates a programmable connection with signal flow going onto the line pointed to by the apex of the triangle. (The signal is of course then present on the full length of the line. Thus, a triangle pointing in the opposite direction would have the same signal flow because the triangle points to the same line.) A triangle showing a connection between two buses indicates that at least one connection exists between the lines making up the buses. In accordance with one embodiment of the present invention, programmable connections are provided by using programmable interconnection points (PIPs), wherein each PIP includes at least one transistor. Each PIP is programmed in response to a configuration data value stored in a corresponding configuration memory cell.

A line which ends within a tile or block structure (i.e., does not extend to the border of a tile or block) is physically terminated within the tile or block. A line which extends to the border of the tile connects to a line on the next tile, which it contacts when two tiles are abutted together. Note that some lines which extend to an edge of a tile and thus into an adjacent tile change names at the tile boundary.

Simplified Representation of the Inventive Conceipt

Figure 1:
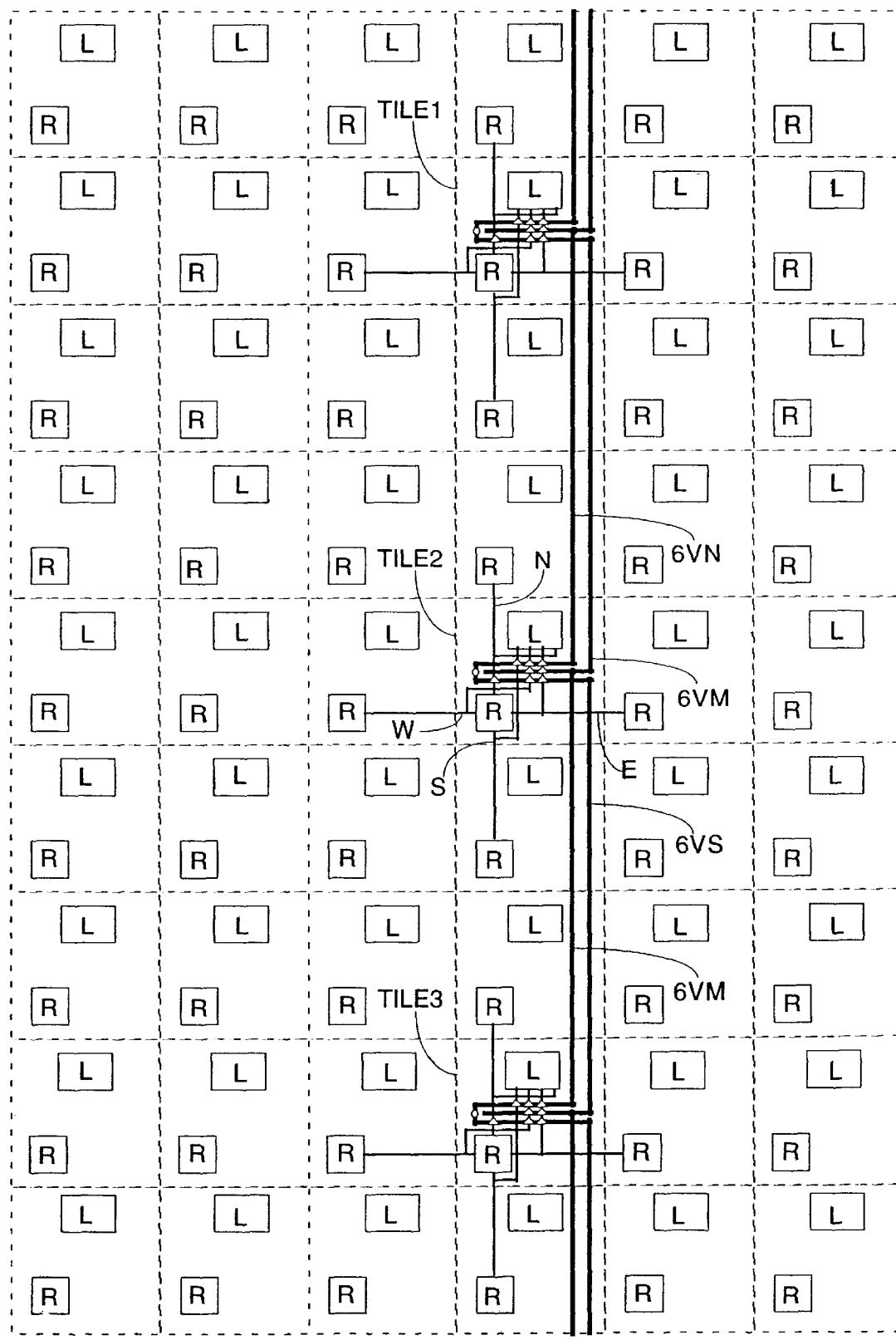
FIG. 1 shows some of the single-length and intermediate-length interconnect lines according to one embodiment of the invention.

FIG. 1 shows in simplified form some of the single-length and intermediate-length interconnect lines according to one embodiment of the invention. FIG. 1 illustrates part of an array of tiles in an FPGA. In each tile is logic block L and a routing or switching structure R. Also in each tile are line segments which connect to line segments in adjacent tiles to form interconnect lines. Most of the interconnect lines in the FPGA are not shown in FIG. 1 so as not to obscure the connectivity of the invention. Three of the tiles, labeled TILE1, TILE2, and TILE3 are shown in more detail, and short- and intermediate-length interconnect lines extending from TILE1, TILE2, and TILE3 are shown. (However, intermediate-length lines extending horizontally are not shown.) Single-length lines N, S, E, and W extend north, south, east, and west, respectively, from TILE2 to the four neighboring tiles. Equivalent lines not labeled extend from TILE1 and TILE3 as well. Identical structures are also present in all other tiles but are not shown in FIG. 1. These single-length lines N, S, E, and W extend between switching structures R in neighboring tiles; and have programmable connections to logic block L.

Intermediate-length lines also extend north, south, east and west from each tile to connect to other tiles three and six tiles away. Therefore in this embodiment the intermediate-length lines are "hex lines" as previously defined. Only the vertically extending (north and south) hex lines are shown, to avoid obscuring the connections. (Later figures show the complete connection pattern.)

From TILE2, hex line 6VN extends to the north a length of six tiles, connecting to TILE1 three tiles to the north and to another tile (not shown) six tiles to the north. Also from TILE2, hex line 6VS extends to the south six tiles, connecting to TILE3 and to another tile (not shown) six tiles to the south. Hex line 6VM connects tile TILE2 to tiles TILE1 and TILE3. Thus, three hex lines extend vertically and connect to TILE2. Also in TILE2, line 6VS is programmably connectable to line 6VN, as indicated by the PIP joining the ends of these two lines. In this manner an easy connection is available to a tile twelve tiles away from the starting tile. Only one additional connection is needed to extend the connection to another interconnect line six tiles long.

Note that within TILE2, only the single-length lines N, S, E, and W have access to logic block L. Thus a signal on a hex line must transfer to a single-length line to access logic block L in the destination tile. A signal entering TILE2 on line 6VS can connect to lines W, N, or E and thereby to logic block L in TILE2. Further, the signal now on single-length lines W, N or E can also access the logic block L in the tiles to the west, north or east of TILE2. In this embodiment, no connection from hex line 6VS to single-length line S is provided, as eliminating this connection saves silicon area and the tile to the south of TILE2 can be accessed through another path. In the embodiment of FIG. 1, a signal in TILE3 can reach the logic block of the tile to the south of TILE2 either by: 1) traversing two single-length lines to the north; or 2) taking hex line 6VM to TILE2, connecting to single-length line W or E, then entering switching structure R in TILE2 and "bouncing" (moving onto and off of an interconnect line in the same tile) from single-length line W or E to single-length line S inside the switching structure. The second alternative has one more PIP in the signal path than the first alternative, the PIP in switching structure R. In another embodiment, a connection to the south can of course be provided.

Repeatable Tile Representation

Figure 2:
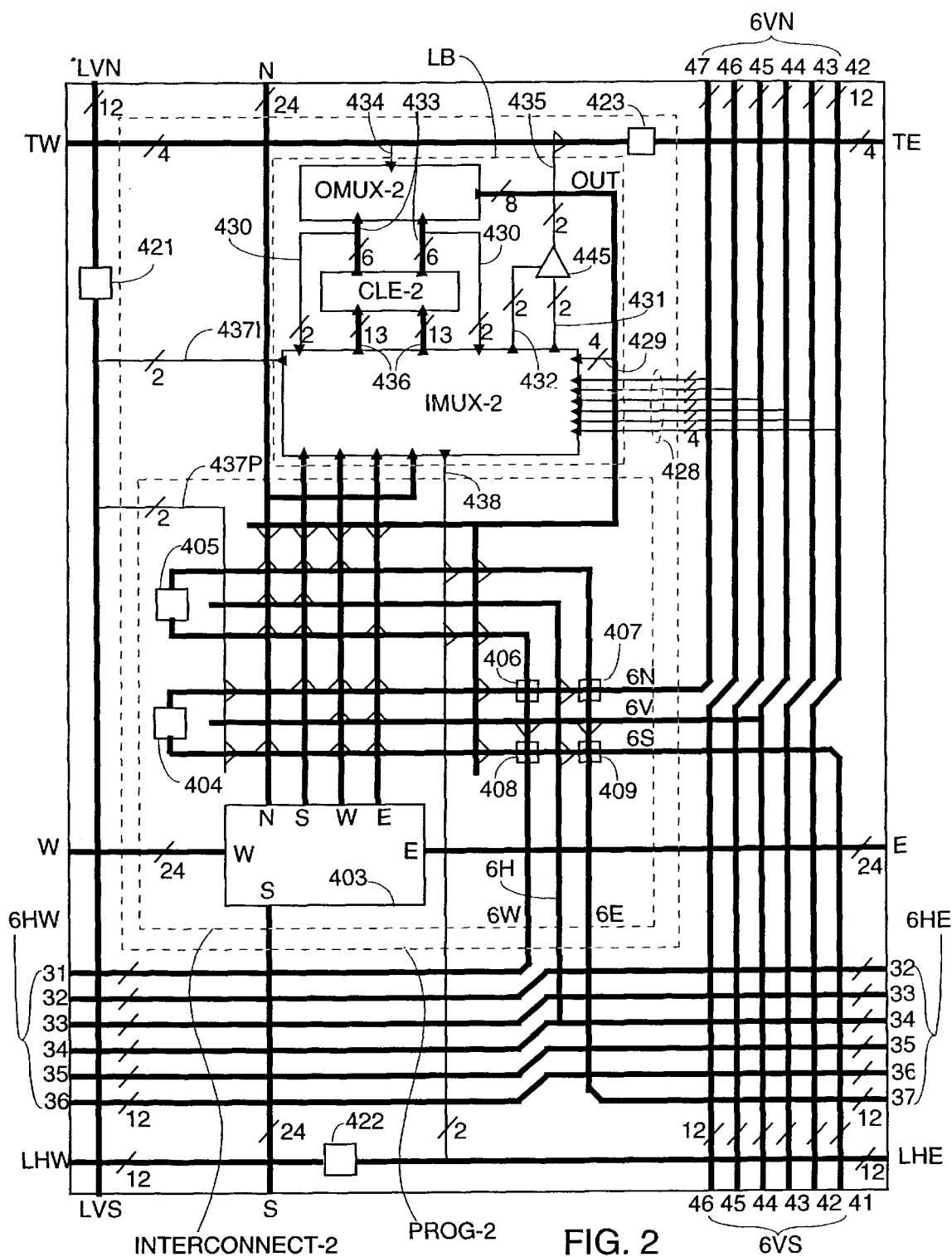
FIG. 2 shows a bus representation of a single tile in which intermediate-length lines are connected to every third and sixth tile (i.e., hex buses are used).

FIG. 2 more completely illustrates a single tile. FIG. 2 shows bus segments of various widths, as indicated by diagonal slash lines having a number indicating the bus width. The number of lines in each bus segment can of course vary in different embodiments. In the embodiment of FIG. 2, the tiles are identical. Since the illustration is of a single tile, complete interconnect lines must be understood by realizing that bus segments extending to the top of FIG. 2 will contact bus segments at the bottom of another copy of FIG. 2 placed adjacent to the north. Similarly, bus segments extending to the right of FIG. 2 will contact bus segments of another copy of FIG. 2 placed adjacent to the right, and so forth. An array such as present in an FPGA is represented by placing many copies of FIG. 2 together.

Hex Buses

In FIG. 2, 12-segment bus 6N extends horizontally through programmable region PROG-2, then turns north to become bus segment 47. Bus segment 47 extends to the top edge of the tile. Another copy of FIG. 2 placed adjacent and to the north of FIG. 2 will have a bus segment 46 extending to the bottom of the copy that contacts bus segment 47. Bus segment 46 extends vertically through the tile, but is offset right by one bus before it reaches the top of the tile, such that bus segment 46 in a given tile contacts bus segment 45 in the tile adjacent to the north. Similarly, at the tile boundary, bus segment 45 contacts bus segment 44, bus segment 44 contacts bus segment 43, bus segment 43 contacts bus segment 42, and bus segment 42 contacts bus segment 41. This offset arrangement results in a hex length bus extending through six adjacent tiles. Bus segment 41 extends into the tile from the bottom, then turns west and extends horizontally through programmable region PROG-2 as bus segment 6S. Bus segment 6V also extends horizontally through programmable region PROG-2, and connects to bus segment 44. Each tile therefore includes three bus segments 6N, 6V, and 6S extending into programmable region PROG-2. These bus segments enable the connections from a given tile to tiles three and six tiles away, which makes these intermediate-length lines hex lines as defined above. Bus segments 41, 42, 43, 44, 45, 46 and 47 together form a 72-line vertical "routing track" designated 6VN at the north end and 6VS at the south end of FIG. 2. Bus segments 42, 43, 44, 45, and 46 are called "interior segments", and bus segments 41 and 47 are called "end segments".

Horizontal 12-segment hex buses are similarly provided, each tile having portions 6W, 6H, and 6E extending into programmable region PROG-2. Bus segment 6E extends from programmable region PROG-2, then turns east and extends as bus segment 37 to the east edge of the tile. Bus segment 37 of a given tile contacts bus segment 36 in the adjacent identical tile to the east. Similarly to bus segments 41–47, bus segments 31–37 provide a hex length bus extending through six adjacent tiles. Bus segment 31 extends into programmable region PROG-2 as bus segment 6W. Bus segment 34 extends into programmable region PROG-2 as bus segment 6H. Bus segments 31, 32, 33, 34, 35, 36 and 37 together form a 72-line horizontal routing track designated 6HW at the west end and 6HE at the east end of FIG. 2.

Note that 72-line hex buses 6VN, 6VS, 6HW, 6HE are not typical buses in that the hex lines making up the buses do not all start in the same tile and end in the same tile, i.e., there is no fixed boundary for the bus. Twelve hex lines end, and another twelve hex lines begin, in each tile. This feature, among others, distinguishes the inventive structure over that of Kean and other hierarchical interconnect structures. In the hierarchical interconnect structures, an FPGA is divided hierarchically with periodic routing structures at the hierarchical boundaries. The present invention uses identical tiles, each of which tiles includes end segments of some of the lines.

Other Buses

Figure 2A:
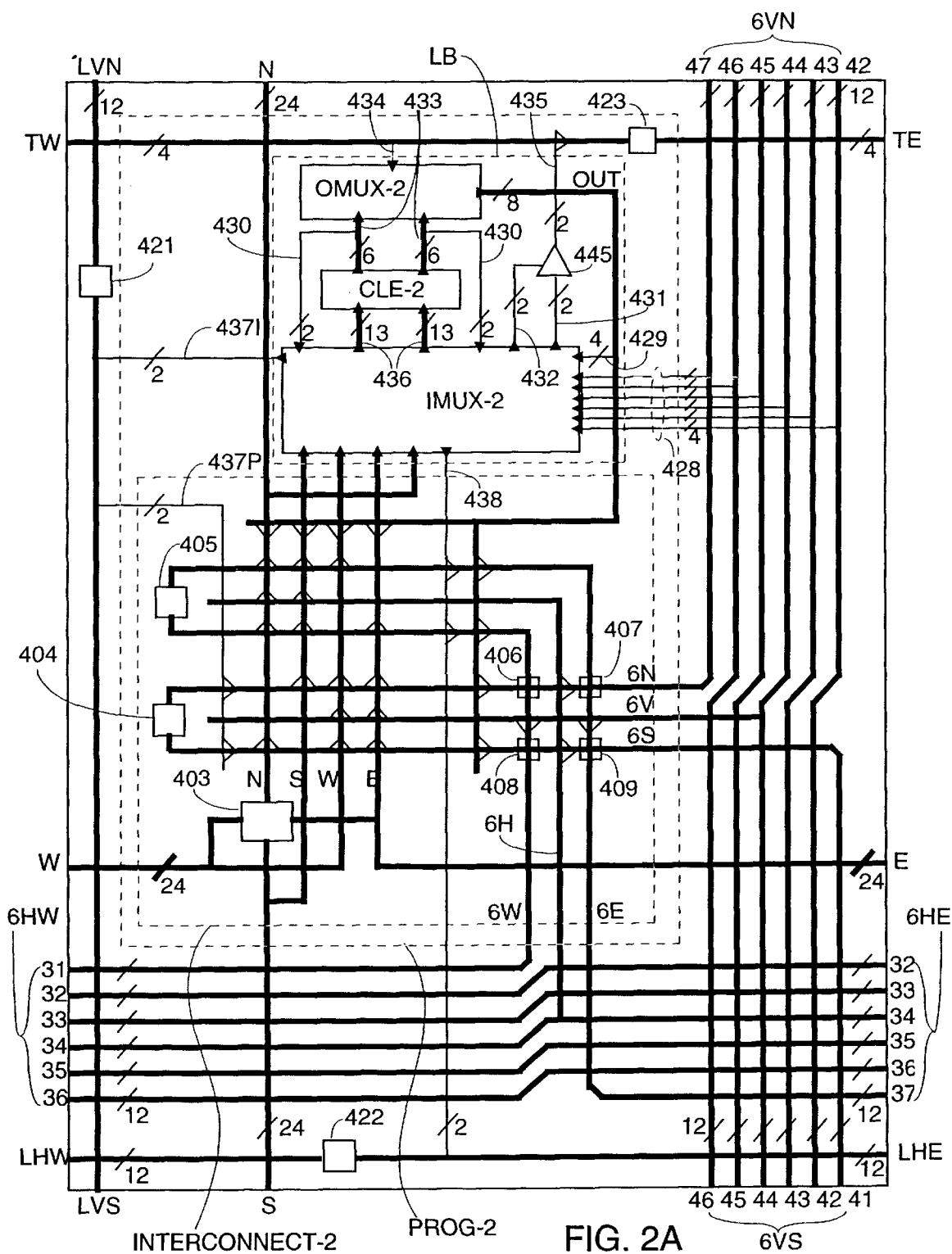
FIG. 2A is a slightly modified version of FIG. 2 showing a different representation of the single-length buses and switching structure 403.

North, south, east, and west single-length buses (N, S, E, and W respectively), each 24 lines wide, are also provided. These single-length buses connect to each other within switching structure 403 located in programmable region PROG-2. In FIG. 2, single-length buses S, W and E are shown entering switching structure 403 in two positions, in order to correspond to FIG. 4. However, the bus segments labeled S,W, and E pass continuously through switching structure 403. The way these bus segments pass through switching structure 403 is clarified in FIG. 2A, which shows a different representation of switching structure 403, but is otherwise the same as FIG. 2.

In this embodiment, each single-length line can be connected to the input multiplexer IMUX-2. Each single-length line can also be connected to some of the hex lines.

FIG. 2 includes another feature: horizontal and vertical long line buses. Each of the two long line buses is 12 lines wide. Two-line buses 437P, 438 (corresponding to lines LV0 and LV6, LH0 and LH6, respectively, in FIGS. 4 and 7) taken from each long line bus extend into programmable region PROG-2 where they can be programmably connected to drive hex lines. The two accessed long lines in each long line bus are separated from each other by six lines, and each long line is accessed every sixth tile. Two-line buses 437I, 438 taken from each long line bus extend from input multiplexer IMUX-2, which can provide signals to the long lines. (Two-line bus 437I includes the same two signals as two-line bus 437P.) The horizontal long line bus is designated LHW at the west end and LHE at the east end of FIG. 2. LHW and LHE extend through an offset region 422 (shown in FIG. 3) which offsets the bus by one line per tile. In this manner, each identical tile accesses two different lines of horizontal long line bus LHW/LHE, and each long line is accessed every sixth tile. Similarly, the vertical long line bus is designated LVN at the north end and LVS at the south end of FIG. 2. LVN and LVS extend through an offset region 421 similar to offset region 422. The long line buses extend the entire length or width of the tile array.

Figure 3:
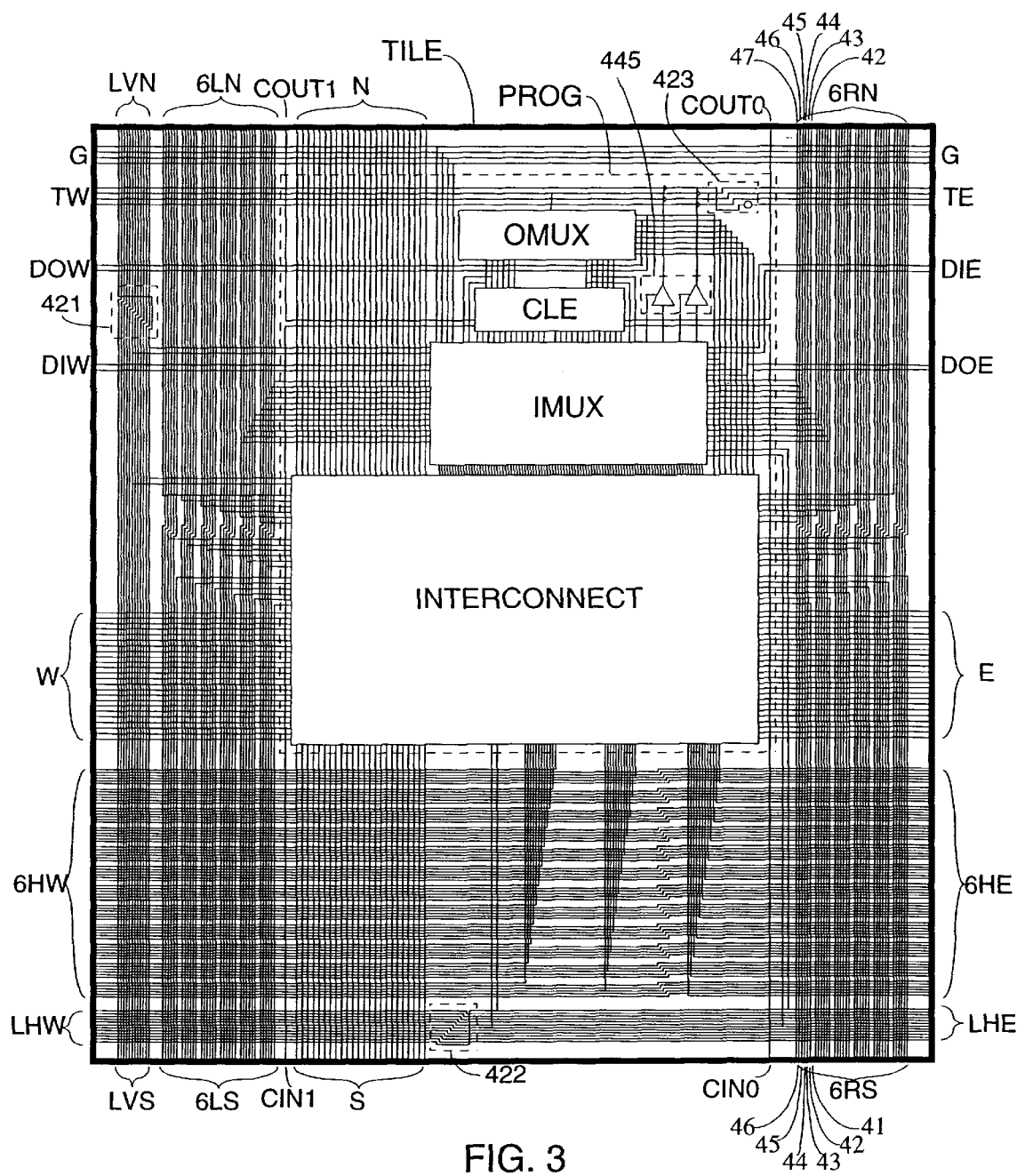
FIG. 3 shows a detailed representation of a single tile in the preferred embodiment. All features shown in FIG. 2 are represented, and some additional features are included.

Another bus extends horizontally through the programmable region PROG-2, a tristate buffer bus, 4 lines wide, designated TW at the west end and TE at the east end of FIG. 2. TW and TE are connected by programmable offset region 423. Programmable offset region 423 is similar to offset regions 421 and 422 in that it offsets the bus by one line; however, programmable offset region 423 is only four lines wide and also includes one programmable bi-directional PIP for extending the length of bus TW or TE. (The internal structure of programmable offset region 423 is shown in FIG. 3.) This PIP can be used either to "break" each line of the tristate bus every fourth tile, or to connect lines together every fourth tile to continue a tristate line up to the full width of the tile array. Two examples of tristate buses that can be used are described in U.S. Pat. No. 5,677,638, "High Speed Tristate Bus with Multiplexers for Selecting Bus Driver", by Steven P. Young et al, and U.S. Pat. No. 5,847,580, "High Speed Bi-directional Bus with Multiplexers", by Bapat et al, both of which are incorporated herein by reference.

Programmable Bus Connections

Programmable bus connections are located in region INTERCONNECT-2, which is part of programmable region PROG-2. Where hex buses cross single-length buses, open triangles indicate programmable connections in which one of the hex lines at the base of the triangle can drive one of the single-length lines at the tip of the triangle. Triangles pointing to hex lines represent buffered connections, and triangles pointing to single-length lines represent unbuffered connections such as simple pass transistors.

Note that not all intersections have triangles. For example, hex bus segment 6V can connect to east and west single-length buses E and W, but not to north and south buses N and S. Similarly, hex bus segment 6H can connect to north and south single-length buses N and S, but not to east and west buses E and W. Hex bus segment 6S coming from the south can connect to east and west single-length buses E and W and also to north bus N. This partial connectivity saves silicon area while still providing useful connections for good routability and performance. Similarly, hex bus segment 6N coming from the north can connect to east and west single-length buses E and W and also to south bus S; hex bus segment 6W coming from the west can connect to north and south single-length buses N and S and also to east bus E; and hex bus segment 6E coming from the east can connect to north and south single-length buses N and S and also to west bus W. In each of these cases, the connection may be limited by hardware or software to being unidirectional such that the hex buses can drive the single-length buses, but the single-length buses cannot drive the hex buses. (In the actual hardware of this embodiment, the connection is a bi-directional pass-gate; whereby the single-length buses can drive the hex buses. However, doing so reduces the speed of the resulting signal path dramatically, and therefore software for programming the FPGA does not select such a path.)

All of the single-length buses can be driven by output multiplexer OMUX-2 by way of output bus OUT. Hex bus segments 6E, 6W, 6N, and 6S can also be driven by output bus OUT.

Figure 4:
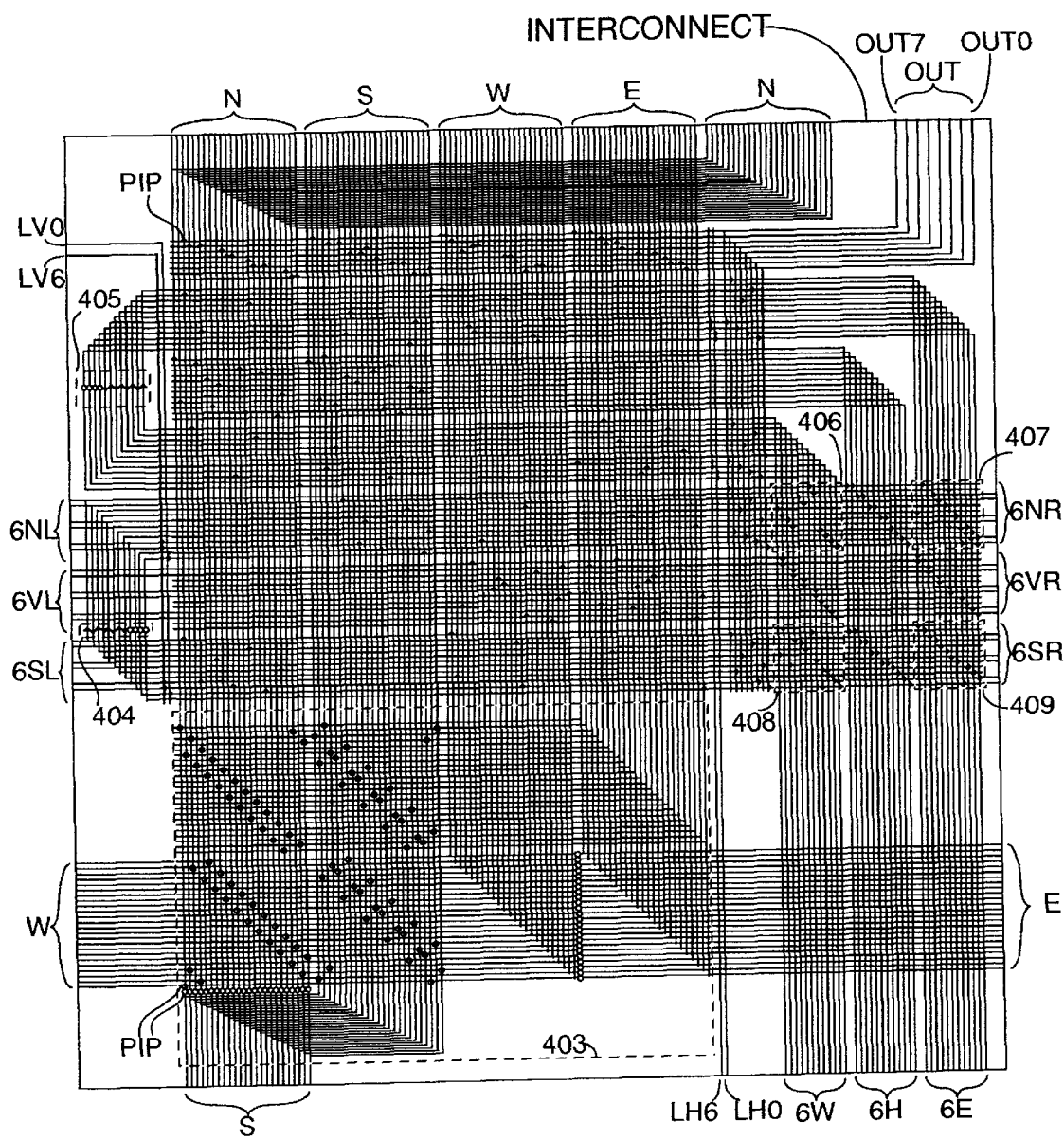
FIG. 4 shows the region of FIG. 3 labeled INTERCONNECT.

Vertical hex bus segments 6N and 6S can be connected together via programmable bus connection 404. (The internal structure of programmable bus connection 404 is shown in FIG. 4.) In this fashion, a line in a vertical hex bus can be continued 12, 18 or more tiles, rather than terminating after 6 tiles. Similarly, horizontal hex bus segments 6w and 6E can be connected together via programmable bus connection 405. Additionally, vertical hex bus segments 6N and 6S can be connected to horizontal hex bus segments 6W and 6E via programmable bus connections 406, 407, 408, and 409. The connectivity of these bus connections is shown in FIG. 4. Note also that hex bus segment 6V (which implements the connection to the third tile in the vertical direction) can drive horizontal hex bus segments 6W and 6E. Similarly, hex bus segment 6H (which implements the connection to the third tile in the horizontal direction) can drive vertical hex bus segments 6N and 6S. By this means, the direction of a signal path is easily changed between horizontal and vertical.

Horizontal hex bus segments 6E and 6W in a given tile can be driven by the two horizontal long lines accessed in the same tile. Vertical hex bus segments 6N and 6S in a given tile can be driven by the two vertical long lines accessed in the same tile. This capability allows a signal on a long line to fan out to an entire row or column of tiles with high speed, as later shown in FIGS. 10–12, by routing from the long line to each hex line (and hence to single lines) rather than propagating serially along the hex lines.

Switching structure 403 allows each single-length bus (N, S, E, W) to be connected to each of the other single-length buses. The connectivity in switching structure 403 is shown in FIG. 4, and is also described and shown in detail in FIG. 6A of U.S. Pat. No. 5,828,230 entitled "FPGA Two Turn Routing Structure with Lane Changing and Minimum Diffusion Area" by Steven P. Young, which is incorporated herein by reference.

Significance of Programmable Bus Connections

The bus connections in FIG. 2 implement an interconnect structure for FPGAs according to the invention. The buses of this embodiment interact in the following ways: 1) long lines can drive hex buses parallel thereto, but cannot drive either perpendicular hex buses or single-length buses except through the parallel hex buses; 2) hex buses can drive single-length buses both parallel and perpendicular thereto, but single-length buses cannot drive hex buses (although in one embodiment hex buses and single-length buses are connected through bi-directional PIPs, so a software limitation is imposed to make these connections unidirectional); 3) hex buses can further drive other hex buses both parallel and perpendicular thereto; and 4) most hex buses cannot connect to the inputs of input multiplexer IMUX-2, although a limited number of lines from the hex buses can make such connections, as is later described. Therefore, in the interconnect structure of FIG. 2, it is preferred to make connections between tiles by placing a signal first on the longest suitable line and from there moving the signal to a shorter line. For example: 1) a connection to a logic block three or six tiles away would be made through a hex line, switching to a single-length line to reach the input multiplexer; 2) a connection to a logic block seven tiles away would be made through first a hex line and then a single-length line (this connection requires no more PIPs than the first example); 3) a connection to a logic block on the other side of the FPGA would be made through first a long line, then a hex line, then transferred to one or more single-length lines before entering the destination input multiplexer. In this manner, large RC trees are avoided, by ensuring that unbuffered PIPs do not drive heavily loaded lines. Further, the various types of signal paths throughout the interconnect structure have similar delays, increasing the overall performance of the circuit.

Of course, many signal paths do not travel only within one column or one row of tiles. To turn a corner, a signal path can move from a given single-length line to a perpendicular single-length line through the switching structure 403, or from a given hex line to a perpendicular hex line.

Programmable Logic Portion of the Tile

The interconnect portion INTERCONNECT-2 of the repeatable tile of FIG. 2 exists only for the purpose of delivering signals between the logic blocks in different tiles. The logic block LB of this embodiment comprises a configurable logic element CLE-2, an output multiplexer OMUX-2, an input multiplexer IMUX-2, and two tristate buffers 445. (The number of tristate buffers can of course vary in other embodiments of the invention.) Configurable logic element CLE-2, input multiplexer IMUX-2, and output multiplexer OMUX-2 in FIG. 2 have small solid black triangles on each input and output. The direction of the apex of the triangle indicates the direction of the signal flow. Thus, a triangle with its apex inside the rectangular box indicates an input line or bus and a triangle with its apex outside the rectangular box indicates an output line or bus.

Input multiplexer IMUX-2 of this embodiment accepts inputs from: 1) each of single-length buses N, S, E, W; 2) four lines 428 of each 12-line vertical hex bus 42, 43, 44, 45, 46, 47; 3) four lines 429 from 8-line output bus OUT from output multiplexer OMUX-2; and 4) a total of four fast-feedback lines 430 from configurable logic element CLE-2. Input multiplexer IMUX-2 can programmably create the following output signals: 1) two 13-line buses 436 that provide input signals to configurable logic element CLE-2; 2) two signal lines 431 that drive the data inputs of tristate buffers 445; 3) two signal lines 432 that enable tristate buffers 445; 4) two lines of vertical long line bus LVS; and 5) two lines of horizontal long line bus LHE.

Configurable logic element CLE-2 accepts only inputs from input multiplexer IMUX-2, and drives 12 output lines shown in FIG. 2 as two 6-line buses 433. Four of these output lines form fast-feedback paths 430 to input multiplexer IMUX-2. Outputs 433 from configurable logic element CLE-2 drive output multiplexer OMUX-2. OMUX-2 gets one additional input 434 from tristate buffer bus TW, and drives 8-line output bus OUT. Each of the two tristate buffers 445 drives two of the tristate lines in tristate buffer bus TW via 2-line bus 435. The connection of tristate buffers 445 to tristate buffer bus TW is shown in more detail in FIG. 3.

Detailed Repeatable Tile Representation

FIGS. 3–12 show the preferred embodiment of a repeatable interconnect structure according to the invention, which embodiment is similar to the embodiment of FIG. 2. FIG. 3 shows a detailed representation of a single tile 300 in the preferred embodiment. All features shown in FIG. 2 are represented, and some additional features are included. Labels in FIG. 3 correspond to the same labels in FIG. 2; thus corresponding structures are easily identified. There is one difference in representation: in FIG. 3, 72-line vertical routing track 6VN /6VS of FIG. 2 is represented as two 36-line vertical routing tracks, 6RN/6RS on the right and 6LN/6LS on the left. Half of the lines of each 12-line hex bus are drawn on each side of programmable region PROG, which corresponds to programmable region PROG-2 in FIG. 2. This representational difference has no effect on the functionality of the tile. In FIG. 3, the horizontal and vertical hex buses are shown with first lines of all buses are grouped together. Only the first lines are labeled. For example, labels 41 through 47 represent the first lines of hex bus segments 41 through 47 of FIG. 2. Hex bus segments 31 through 37 of FIG. 2 are similarly represented, but are not labeled in FIG. 3.

Interconnect region INTERCONNECT of FIG. 3 is functionally the same as interconnect region INTERCONNECT-2 of FIG. 2. Features in the embodiment of FIG. 3 that are not shown in FIG. 2 include: 1) horizontal four-line global bus G along the top of the tile provides four global inputs to input multiplexer IMUX, which global inputs can be used to distribute high-fanout or high-speed global clock signals; 2) two direct output connection lines DOW from output bus OUT (driven by output multiplexer OMUX) exit the tile of FIG. 3 on the west edge, where they are connected to input lines DIE of an adjacent tile to the west; 3) two direct input connection lines DIE from the adjacent tile to the east enter the tile of FIG. 3 on the east edge and go to input multiplexer IMUX; 4) two direct output connection lines DOE from output bus OUT exit the tile of FIG. 3 on the east edge, where they are connected to lines DIW of an adjacent tile to the east; 5) two direct input connection lines DIW from the adjacent tile to the west enter the tile of FIG. 3 on the west edge and go to input multiplexer IMUX; and 6) two carry chains are included in configurable logic element CLE, each carry chain having an input on the south edge of the tile and an output on the north edge of the tile, the inputs designated CIN0 and CIN1 and the outputs designated COUT0 and COUT1, respectively. Some embodiments of the interconnect structure according to the invention do not have these features.

Interconnect Region

FIG. 4 shows interconnect region INTERCONNECT of FIG. 3 in detail. All input and output lines are located in the same relative positions in FIGS. 3 and 4. Input and output lines to interconnect region INTERCONNECT in FIG. 3 can be identified by looking at the corresponding labels in FIG. 4. With the exception of the division of the vertical routing track, as described above, FIG. 4 also corresponds directly to the interconnect region INTERCONNECT-2 of FIG. 2. Numerical labels identify features of the implementation previously shown and described. The connectivity in switching structure 403 is also described and shown in detail in FIG. 6A of U.S. Pat. No. 5,828,230 entitled "FPGA Two Turn Routing Structure with Lane Changing and Minimum Diffusion Area" by Steven P. Young, which is incorporated herein by reference.

Programmable bus connections 404 and 405 in FIG. 4 demonstrate an additional feature of the invention. In programmable bus connections 404 and 405, vertical and horizontal hex buses (respectively) are programmably connected together to enable the continuation of a signal path in the same direction from one hex bus to the next. As shown in FIG. 4, some of these connections can be bi-directional (for example, implemented as pass transistors) while others are unidirectional (such as buffered connections). In one embodiment, the bi-directional hex buses (hex buses that can be programmably driven from either end) have more programmable connections to perpendicular buses than do the unidirectional hex buses (hex buses that can be programmably driven from only one end). Such bi-directional connections will be most flexible, while such unidirectional connections will be faster, since the PIP can be implemented as a single buffer without a programmable enable.

Vertical long lines LV0 and LV6 identify the first and seventh lines, respectively, of vertical long line bus LVS that are accessed in each repeatable tile, as previously described. Similarly, horizontal long lines LH0 and LH6 identify the first and seventh lines, respectively, of the horizontal long line bus LHE.

As previously described, hex bus segments 6N, 6V, and 6S of FIG. 2 are divided in FIG. 3 into hex bus segments 6NR, 6VR, and 6SR, which exit the INTERCONNECT region on the east edge to form 36-line vertical routing track 6RN/6RS of FIG. 3, and hex bus segments 6NL, 6VL, and 6SL, which exit the INTERCONNECT region on the west edge to form 36-line vertical routing track 6LN/6LS of FIG. 3.

Unidirectional and Bi-directional Hex Buses

Figure 4A:
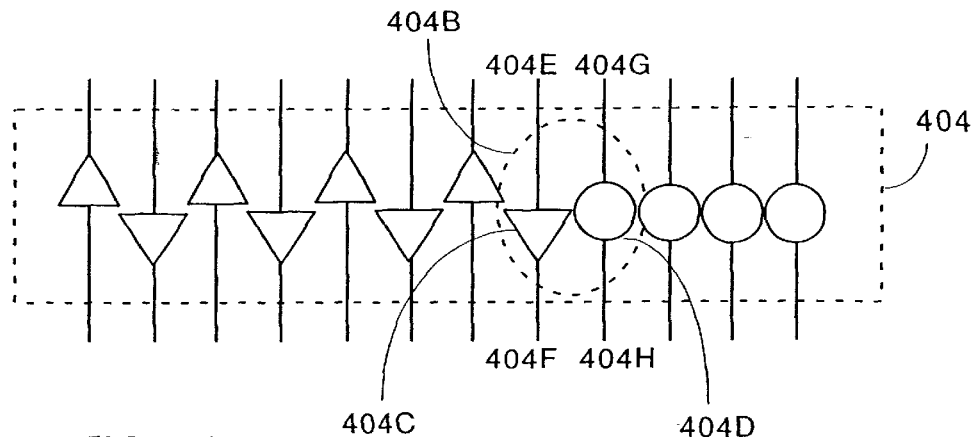
FIG. 4A is a schematic diagram of a programmable bus connection of FIG. 4.

FIG. 4A shows an enlargement of programmable bus connection 404 of FIG. 4. Unidirectional bus connection 404C for programmably connecting interconnect lines 404E and 404F and bi-directional bus connection 404D for programmably connecting interconnect lines 404G and 404H are shown in region 404B of FIG. 4A.

Figure 4B:
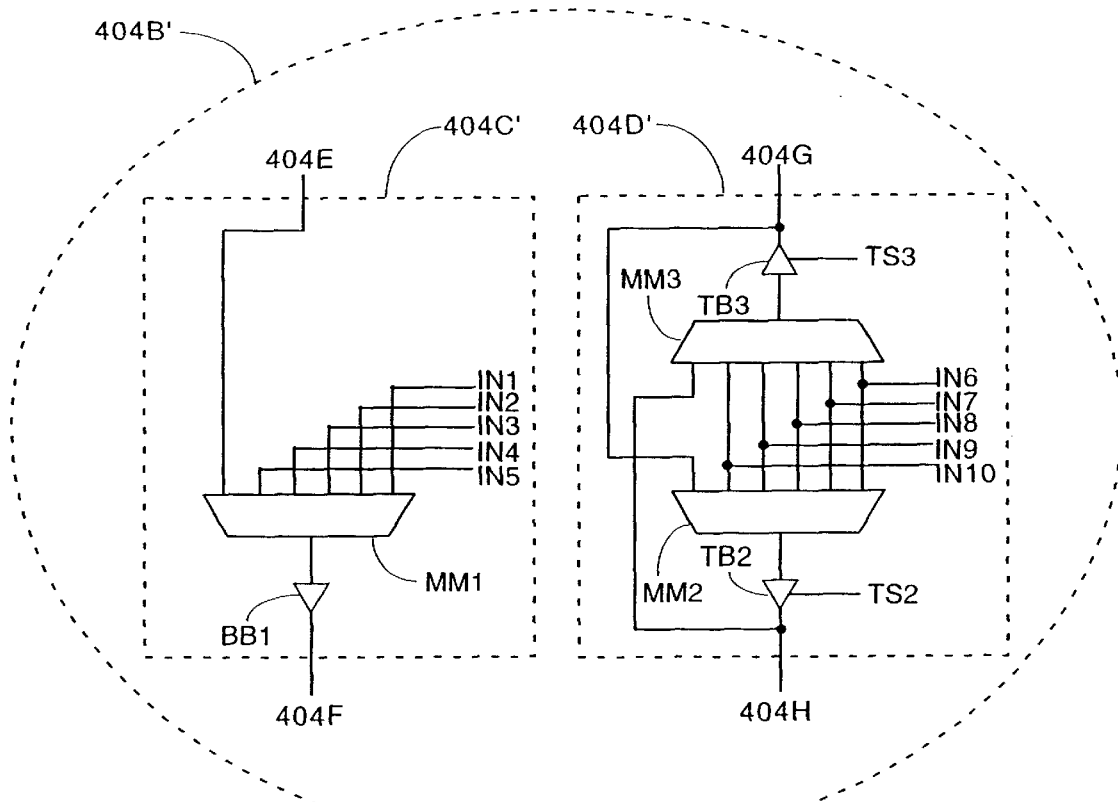
FIG. 4B is a schematic diagram of the programmable bus connection of FIG. 4A.

FIG. 4B shows a different representation of region 404B of FIG. 4A, labeled 404B' in FIG. 4B. Region 404B' includes not only region 404B of FIG. 4A, but also other PIPs shown in FIG. 4 and implemented as part of the same circuit as bus connections 404C and 404D. FIG. 4B includes a logical representation of unidirectional bus connection 404C, with additional PIPs as described above, labeled 404C' in FIG. 4B. FIG. 4B also includes a logical representation of bi-directional bus connection 404D, labeled 404D' in FIG. 4B. Bus connections 404C and 404D are used to interconnect intermediate-length lines in one embodiment of the invention.

Unidirectional bus connection 404C' includes 6-input multiplexer MM1, which can be configured to place the signal on interconnect line 404E onto interconnect line 404F through buffer BB1. Alternatively, multiplexer MM1 can place any of five other signals onto interconnect line 404F. In one embodiment, the five other available signals come from a mixture of intermediate-length lines, output multiplexer outputs, and long lines, as shown in FIG. 4. The number of each of these types of lines used is determined by an analysis of usage in typical FPGA user designs. In one embodiment, the five available signals are shared between pairs of unidirectional bus connections.

As shown in FIG. 4B, bi-directional bus connection 404D' includes more logic than does unidirectional bus connection 404C'. Since signal flow can be in either of two directions, two 6-input multiplexers MM2, MM3 are needed. Input multiplexer MM2 drives interconnect line 404H through tristate buffer TB2, controlled by configurable signal TS2. Similarly, input multiplexer MM3 drives interconnect line 404G through tristate buffer TB3, controlled by configurable signal TS3. Each of multiplexers MM2, MM3 can be configured to place the signal from opposite interconnect line 404G, 404H onto interconnect lines 404H, 404G. Alternatively, multiplexers MM2, MM3 can place any of five other signals onto interconnect lines 404H, 404G. In the embodiment of FIG. 4B, the five input signals are shared between multiplexers MM2, MM3 in order to facilitate the use of shared diffusion regions, but some or all of the inputs can be independent, and the number of available inputs can be increased or decreased. These and other modifications are within the scope of this aspect of the invention.

Figure 4C:
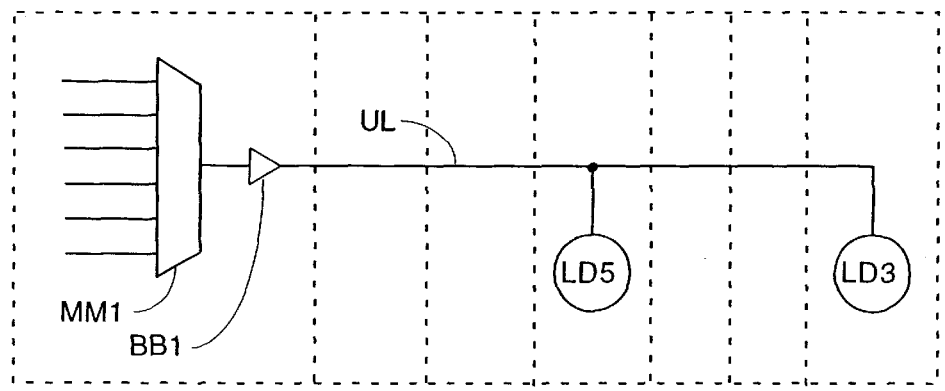
FIGS. 4C and 4D illustrate in simple form the loading for a unidirectional line and a bi-directional line BL, respectively, in one embodiment of the invention.
Figure 4D:
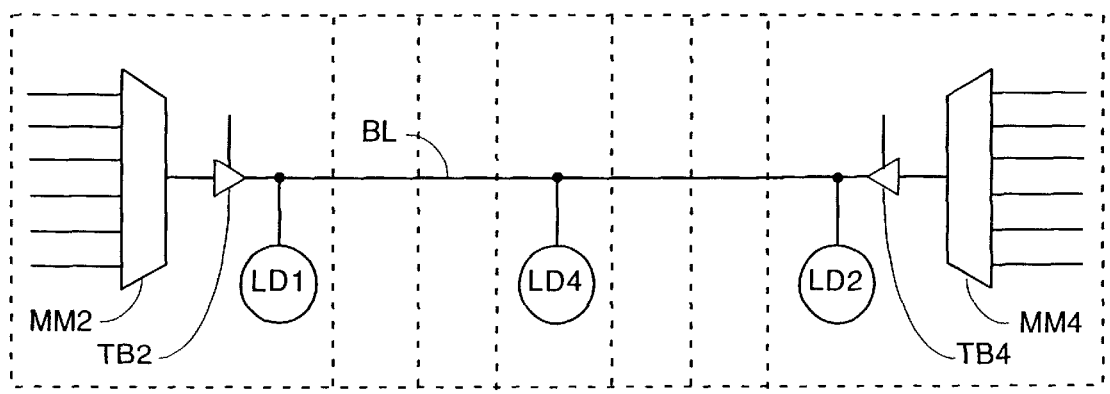

FIGS. 4C and 4D illustrate in simple form the loading for unidirectional line UL and bi-directional line BL, respectively, according to the invention. In FIGS. 4C and 4D, tile boundaries are indicated by dotted lines. As shown in FIG. 4D, bi-directional interconnect line BL is driven at one end by multiplexer MM2 through tristate buffer TB2 and at the other end by multiplexer MM4 through tristate buffer TB4. At most one of tristate buffers TB2 and TB4 is enabled at a given time. In the embodiment of FIG. 4C, bi-directional interconnect line BL drives loads LD1, LD2 at either end of interconnect line BL. As shown in FIG. 4C, unidirectional interconnect line UL is driven by multiplexer MM1 through nontristate buffer BB1, and drives load LD3 at only one end. (In the embodiment of FIGS. 4C and 4D, both bi-directional and unidirectional lines (BL, UL) also drive loads (LD4, LD5, respectively) at the midpoint of the interconnect line. In other embodiments, interconnect lines drive loads at other intermediate points.) Each of loads LD1, LD2, LD3, LD4, LD5 typically comprises many PIPS. In addition, when an unbuffered PIP is turned on, the capacitive load on the other side of the PIP becomes part of the load on interconnect lines BL, UL. Therefore, loading is typically larger on bi-directional interconnect lines, slowing these lines with respect to unidirectional lines.

More silicon area is required to implement a bi-directional than a unidirectional interconnect line, as shown by the addition of structures LD1, TB4 and MM4 for bi-directional line BL in FIG. 4D, as compared to unidirectional line UL in FIG. 4C. Further, a signal passing through a tristate buffer, as required for a bi-directional interconnect line, is typically slower than a signal through a non-tristate buffer. The additional logic required to implement a tristate buffer slows passage of the signal through the buffer. Therefore, a mixture of unidirectional and bi-directional lines provides a balance of flexibility and performance.

Output Multiplexer OMUX

Figure 5:
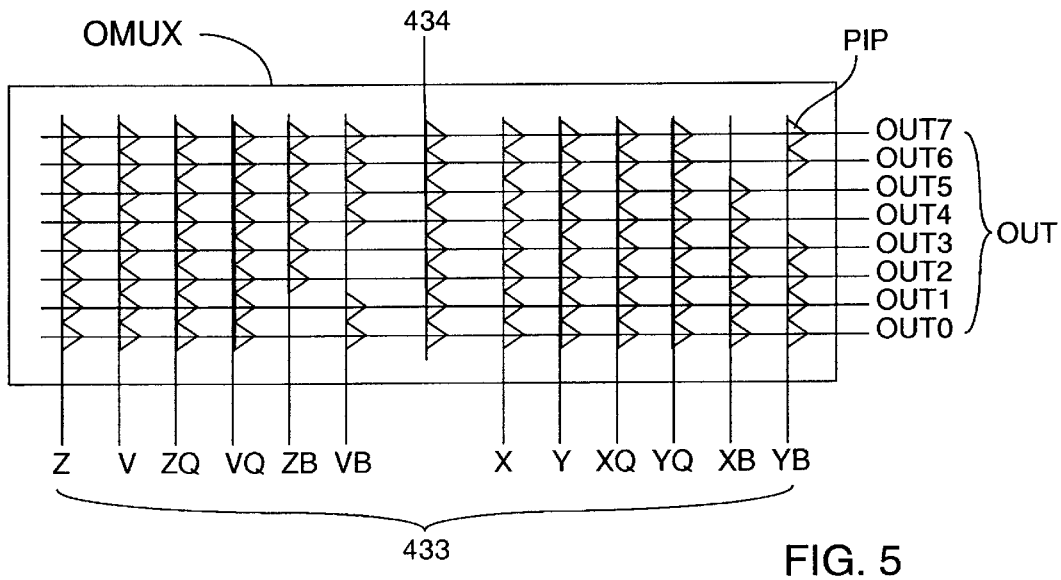
FIG. 5 shows the output multiplexer (OMUX) of FIG. 3.
Figure 6:
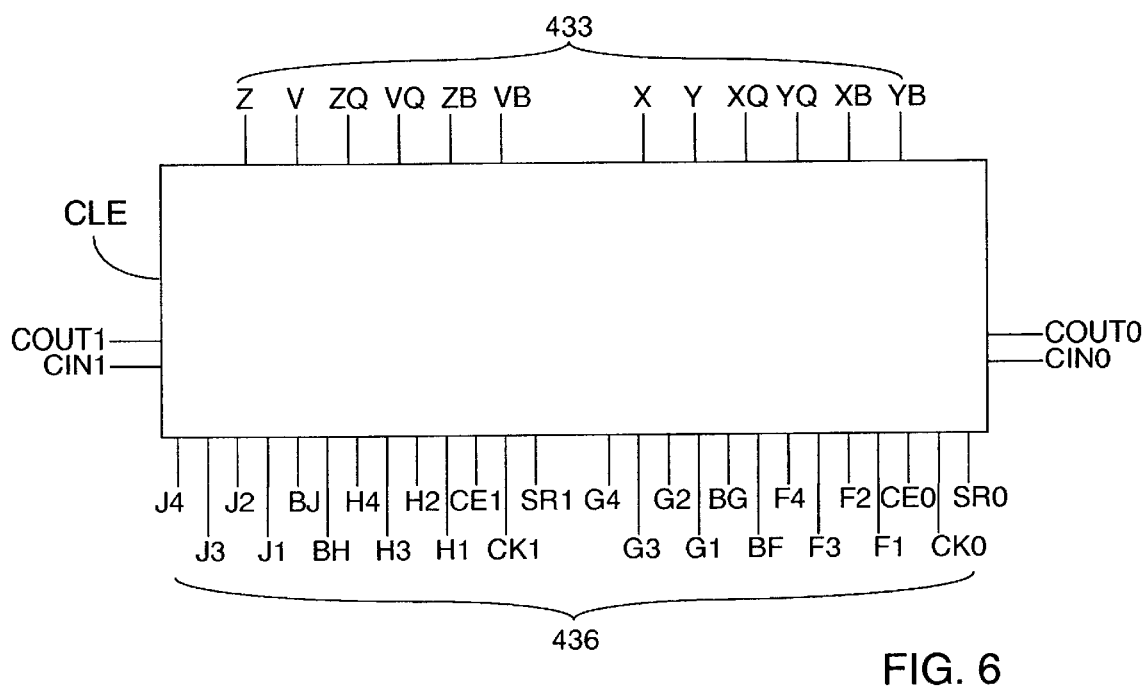
FIG. 6 shows the input and output signals for the configurable logic element (CLE) of FIG. 3.
Figure 7:
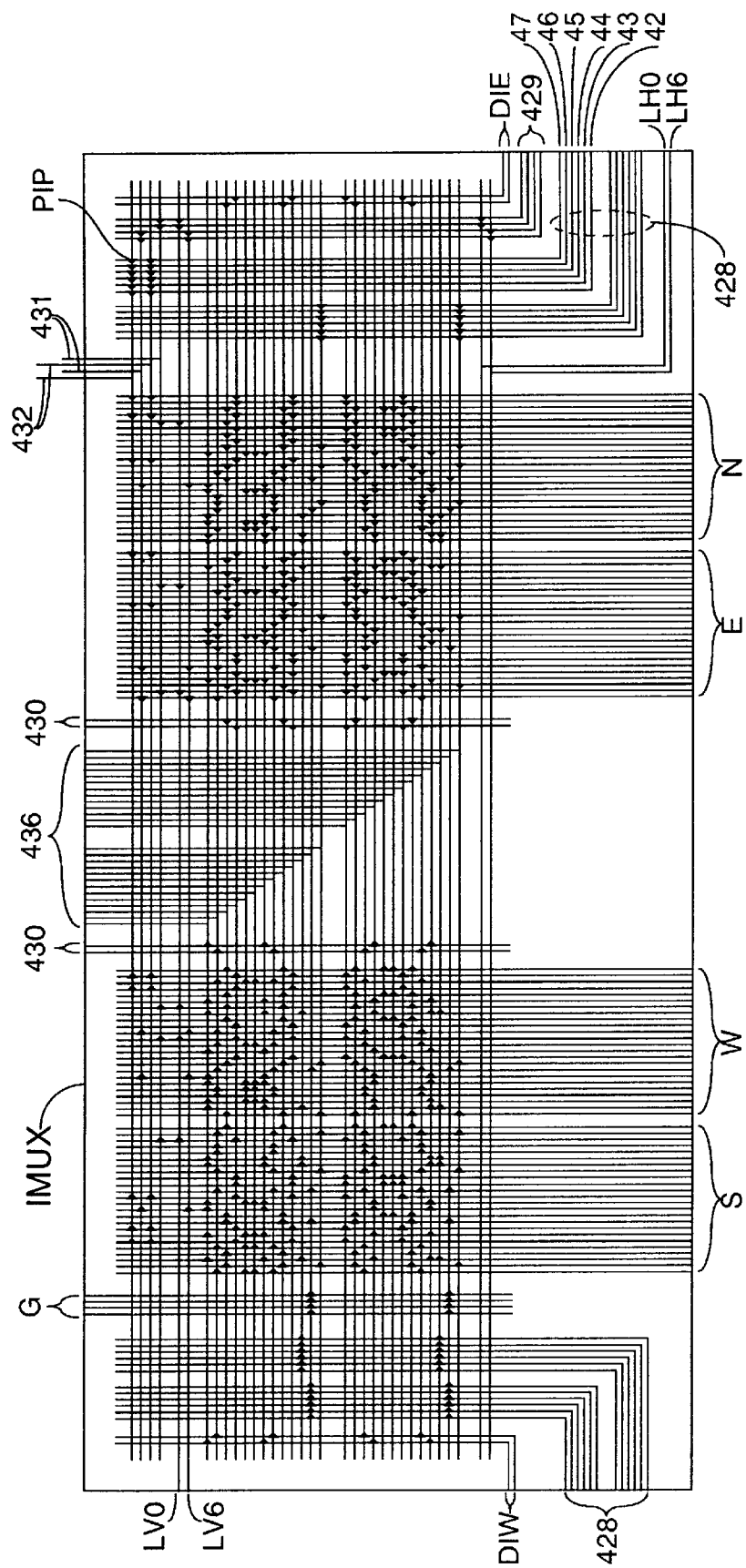
FIG. 7 shows the input multiplexer (IMUX) of FIG. 3.

FIGS. 5, 6 and 7 show the output multiplexer (OMUX), configurable logic element (CLE) and input multiplexer (IMUX), respectively, of the embodiment shown in FIG. 3. All input and output lines are physically located in the same relative positions in FIGS. 3, 5, 6 and 7, thus input and output lines may readily be traced between the figures. The PIP patterns shown in FIGS. 5 and 7 form only one of many possible patterns. The implementation of these three blocks, and the connections between the blocks, may differ widely in different embodiments of the invention, provided that the three blocks are compatible with each other. For example, the number of connections between the blocks may be increased or decreased. Further, two or more of these blocks may be combined, or one or both of the input or output multiplexers may be eliminated. Although these variations are not further described herein, such modifications are encompassed by the inventive concept. It will be apparent to one skilled in the art after reading this specification that the present invention may be practiced within these and other architectural variations.

FIG. 5 shows details of the interior of output multiplexer OMUX. As shown in FIG. 5, the input lines (the outputs of logic block CLE) are selectively programmed to drive a series of eight outputs (OUT0 to OUT7). Not all inputs can drive all outputs; a selection of how many PIPs to provide and where they should be located is typically made based on the trade-off constraints of performance, silicon area, and routing flexibility.

Configurable Logic Element CLE

FIG. 6 shows the input and output signals for the configurable logic element (CLE) of the embodiment shown in FIG. 3. Many configurable logic elements can be used with the interconnect structure of the invention. For example, pages 4-11 through 4-23 of the Xilinx 1996 Data Book entitled "The Programmable Logic Data Book", available from Xilinx, Inc., 2100 Logic Drive, San Jose, Calif. 95124, also incorporated herein by reference, describe a configurable logic element used in the XC4000 Series FPGA architecture which is compatible with the invention. Pages 4-294, 4-295, and 13-13 through 13-15 of the same document, also incorporated herein by reference, describe another compatible configurable logic element, used in the XC3000 Series FPGA architecture. Pages 4-188 through 4-190 of the same document, also incorporated herein by reference, describe yet another compatible configurable logic element, used in the XC5200 Family FPGA architecture.

Figure 6A:
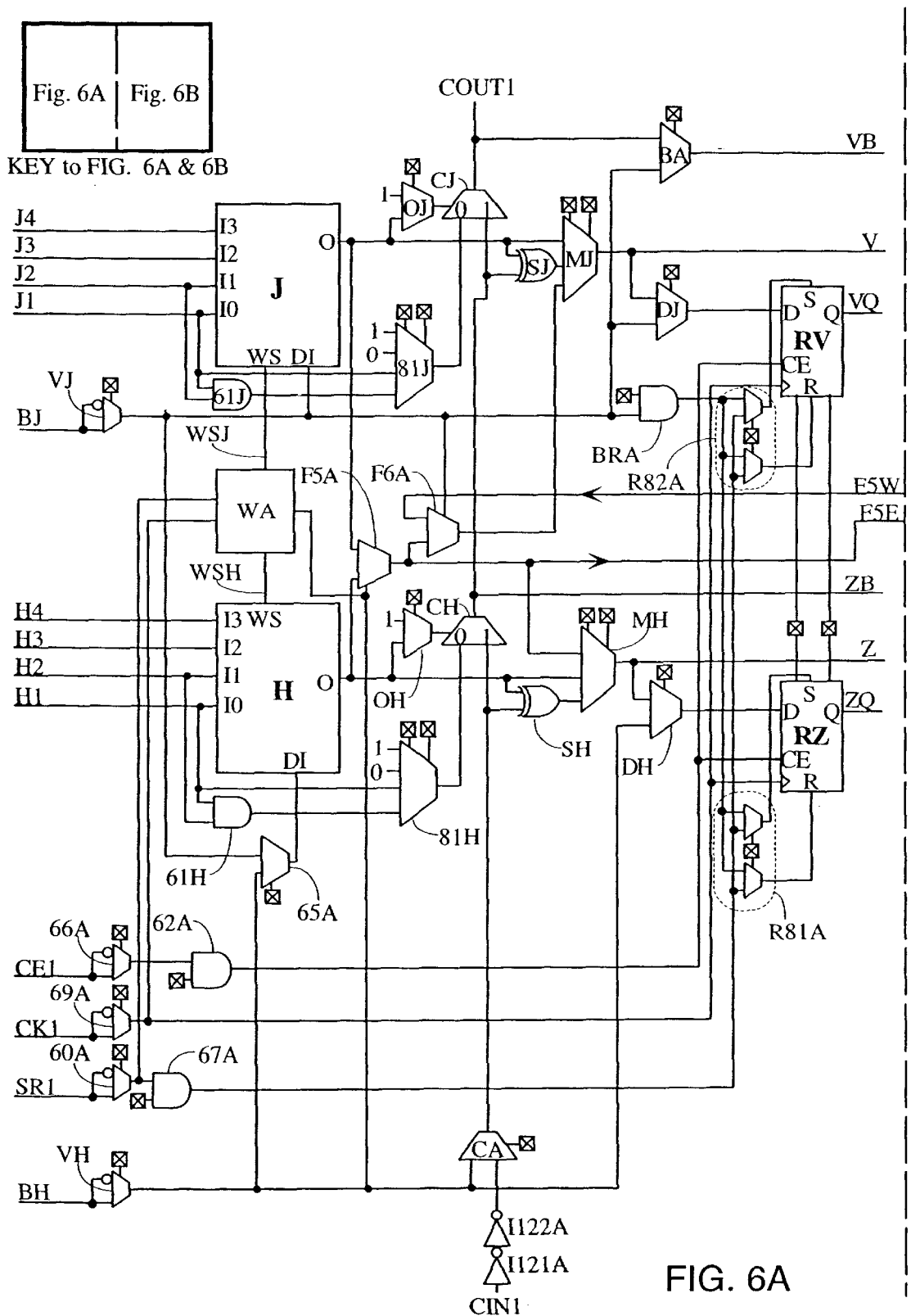
FIGS. 6A and 6B show the internal logic for the CLE of FIG. 3. To view the entire CLE, FIGS. 6A and 6B must be viewed together as shown in the key at the top of FIG. 6A.
Figure 6B:
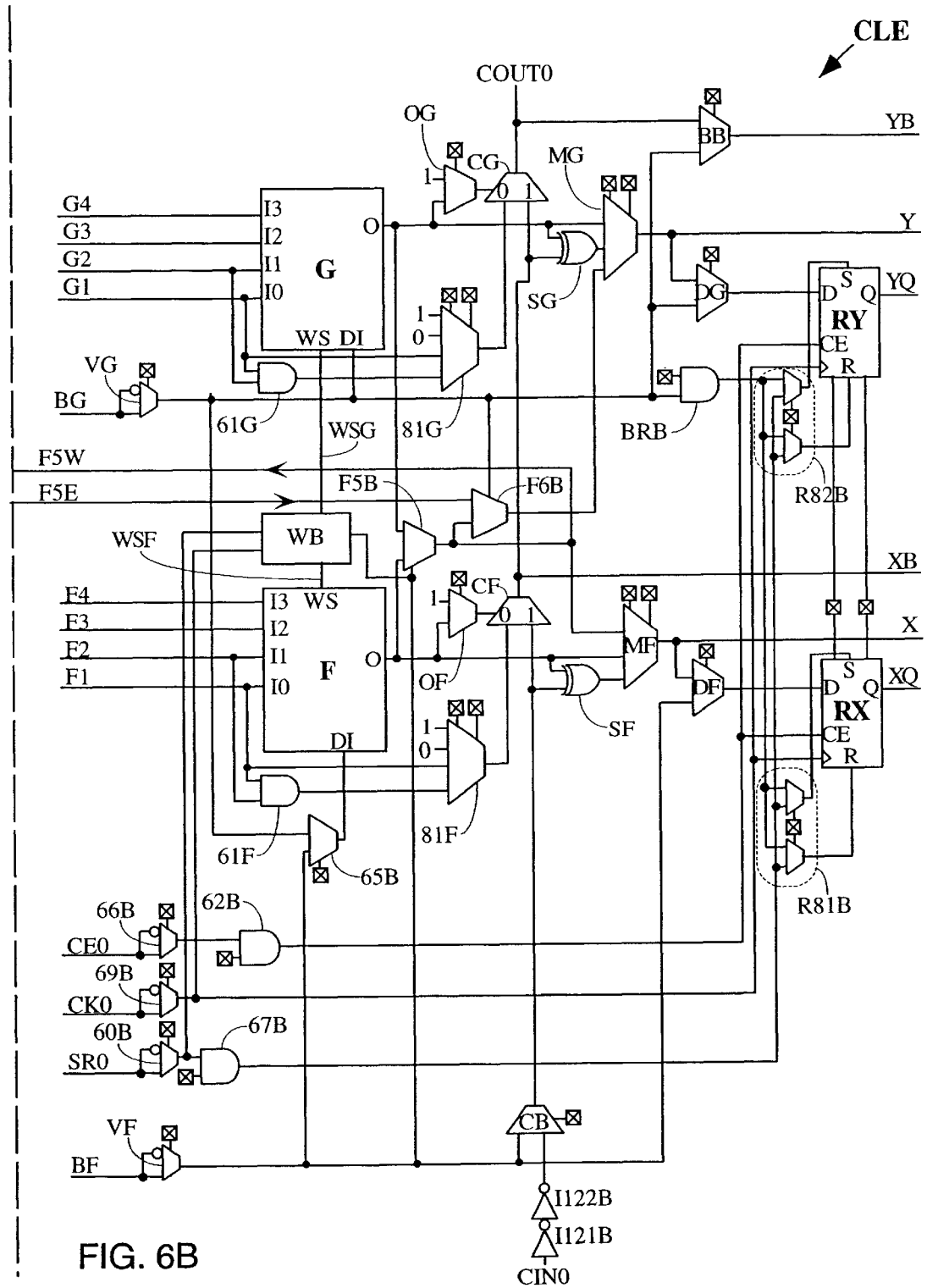

One CLE that can be used with the embodiment of FIG. 3 is shown in FIGS. 6A and 6B. In this embodiment, the CLE is implemented in two similar portions called "slices". To view the entire CLE, FIGS. 6A and 6B, each showing one slice, must be viewed together as shown in the key at the top of FIG. 6A. Programmable (configurable) bits controlling the function of the CLE are shown as small boxes containing an "x".

The details of one function generator compatible with the interconnect structure of the invention are shown and described in commonly assigned, co-pending U.S. application Ser. No. 08/786,818 entitled "Configurable Logic Block with AND Gate for Efficient Multiplication in FPGAs" by Chapman et al, which is referenced above and incorporated herein by reference.

One CLE compatible with the interconnect structure of the invention is the CLE of FIGS. 6A and 6B, which includes four function generators: F and G in FIG. 6B, and H and J in FIG. 6A. Function generator F has four inputs F1, F2, F3, F4; function generator G has four inputs G1, G2, G3, G4; function generator H has four inputs H1, H2, H3, H4; and function generator J has four inputs J1, J2, J3, J4. Each of function generators F, G, H, J also has a data-in input D1 and an output O. In addition, each function generator F, G has a write strobe WS input WSF, WSG, respectively, generated in write strobe generator WB from clock input signal CK0 optionally inverted by multiplexer 69B, set/reset input signal SR0 optionally inverted by multiplexer 60B, and input signal BF optionally inverted by multiplexer VF. Each function generator H, J has a write strobe WS input WSH, WSJ, respectively, generated in write strobe generator WA from clock input signal CK1 optionally inverted by multiplexer 69A, set/reset input signal SR1 optionally inverted by multiplexer 60B, and input signal BH optionally inverted by multiplexer VH.

Function generators F, G, H, J of FIGS. 6A and 6B preferably include novel features described by Bauer in commonly assigned, co-pending U.S. Patent application Ser. No. 08/754,421 entitled "Lookup Tables Which Double as Shift Registers", which is referenced above and incorporated herein by reference. Briefly, these function generators have the ability to operate as shift registers as well as small RAMs and lookup tables. Write strobe signal WS controls the shifting function and the RAM write cycle. (In one embodiment, write strobe signal WS is implemented as two separate control signals, as described by Bauer.) Data-in port DI carries a data signal (in this embodiment derived from input signals BF, BH, BG, BJ) for writing to an addressed memory cell. When function generators F, G, H, J are configured as shift registers as described by Bauer, the shift register data input signal is taken from BF, BG, BH, BJ, respectively. Write strobe generators WB, WA generate write strobe signals WSF and WSG, WSH and WSJ, respectively. Signals WSF, WSG, WSH, WSJ strobe data into their respective function generators during a write cycle when the function generators are configured as RAM, and cause a shift when the function generators are configured as shift registers. The use of function generators as RAM is described in pages 4-11 through 4-23 of the Xilinx 1996 Data Book entitled "The Programmable Logic Data Book", which pages are incorporated herein by reference.

The function generator of this embodiment can therefore be configured as a look-up table, a shift register, a 16×1 RAM, half of a 16×1 dual-ported RAM (when the two function generators in a slice are paired together), half of a 16×2 RAM, or half of a 32×1 RAM (when the two function generators in a slice are paired together). Not all combinations of function generator configurations are supported in a single slice. The supported combinations are detailed below.

In this embodiment, write strobe signals WSF and WSG are controlled by write strobe generator WB. A High (logic 1) pulse on function generator input WS causes a write to occur to the function generator look-up table, to either the first memory cell of the look-up table (if configured as a shift register) or to an addressed cell (if configured as a RAM). (See commonly assigned, co-pending U.S. patent application Ser. No. 08/754,421 entitled "Lookup Tables Which Double as Shift Registers", which is referenced above and incorporated herein by reference.)

Write strobe generator WB functions as follows in the supported combinations of function generator configurations: a) when function generators F and G are both configured as look-up tables, write strobe signals WSF and WSG are held Low (logic 0); b) when function generator G is configured as a 16×1 RAM or shift register and function generator F is configured as a look-up table, write strobe signal WSF remains Low while write strobe signal WSG pulses High when SR0 is active (Low or High, depending on whether multiplexer 60B is inverting or not) and CK0 makes the proper transition (falling or rising, depending on whether multiplexer 69B is inverting CK0 or not); c) when function generators F and G are configured as a dual-ported 16×1 RAM, a 16×2 RAM, or a pair of shift registers, write strobe signals WSF and WSG pulse High together when SR0 is active and CK0 makes the proper transition; d) when function generators F and G are configured as a single 32×1 RAM, one but not both of write strobe signals WSF and WSG pulses High, when SR0 is active and CK0 makes the proper transition. The generated High pulse occurs on write strobe signal WSF if multiplexer VF is non-inverting and input signal BF is High or if multiplexer VF is inverting and input signal BF is low, otherwise the High pulse occurs on write strobe signal WSG. As can be seen from the above description, SR0 acts as a write enable and CK0 acts as a clock to a synchronous RAM or shift register, while BF serves as a fifth address bit when the two function generators in a slice are configured as a 32-bit RAM.

Write strobe signals WSH and WSJ are generated by write strobe generator WA and controlled by input signals SR1, CK1, and BH, in a corresponding fashion.

AND gates 61F, 61G, 61H, 61J and multiplexers 81F, 81G, 81H, 81J, CF, CG, CH, CJ implement multiplier and carry logic functions as described in commonly assigned, co-pending U.S. patent application Ser. No. 08/786,818 entitled "Configurable Logic Block with AND Gate for Efficient Multiplication in FPGAs" by Chapman et al, which is referenced above and incorporated herein by reference. In FIGS. 6A and 6B, each of multiplexers 81F, 81G, 81H, 81J has separate programmable memory cells that determine the multiplexer output. In another embodiment, the two multiplexers in each slice (81F and 81G, 81H and 81J) share memory cells and therefore have the same programmed functionality.

In the embodiment of FIGS. 6A and 6B, each slice has a separate carry chain. One carry chain is from input signal CIN0 to output signal COUT0 and incorporates the outputs of function generators F and G. The other carry chain is from input signal CIN1 to output signal COUT1 and incorporates the outputs of function generators H and J. In one embodiment, the two carry chains are implemented as described in U.S. Pat. No. 5,629,886, entitled "Method and Structure for Providing Fast Propagation of a Carry Signal in a Field Programmable Gate Array" by Bernard J. New, which is incorporated herein by reference.

Each slice further includes five-input-function multiplexer F5A, F5B and six-input-function multiplexer F6A, F6B. In FIG. 6A, multiplexer F6A receives an input signal on west-going line F5W from the output of multiplexer F5B in FIG. 6B. In FIG. 6B, six-input-function multiplexer F6B receives an input signal on east-going line F5E from the output of multiplexer F5A in FIG. 6A. Multiplexer F6A receives a second input signal from multiplexer F5A, and multiplexer F6B receives a second input signal from multiplexer F5B. Multiplexer F5A receives inputs from outputs 0 of function generators H and J. Multiplexer F5B receives inputs from outputs 0 of function generators F and G.

The CLE of this embodiment receives four extra control signals on lines BF, BH, BG, and BJ. These lines can be programmably inverted using multiplexers VF, VH, VG, and VJ, respectively, and control several useful functions. The five-input function multiplexers F5A, F5B are controlled by lines BH, BF, respectively. The six-input function multiplexers F6A, F6B are controlled by lines BJ, BG, respectively. A user can form a four-input multiplexer using multiplexer F5A and the outputs of function generators H and J, with function generators H and J each configured as a two-input multiplexer. Similarly, a four-input multiplexer can be formed using multiplexer F5B and the outputs of function generators F and G. A user can form an eight-input multiplexer using either multiplexer F6A or multiplexer F6B receiving inputs from both multiplexers F5A and F5B, each of which is receiving outputs from its respective function generators. Further, with multiplexer F5A, the memory cells in function generators H and J can operate as a 32-bit RAM. With multiplexer F5B, the memory cells in function generators F and G can operate as a 32-bit RAM. Lines BF, BH, BG, BJ serve as multiplexer control lines or RAM address lines, in addition to other functions as later described.

Registers RX, RY, RZ, RV generate outputs XQ, YQ, ZQ, VQ, respectively. Clock inputs to registers RX, RY, RZ, RV are designated by open triangles with apexes pointing into these registers. Clock enable inputs CE can be disabled using AND-gates 62A, 62B. (AND-gates 62A, 62B are controlled by a programmable memory cell that provides one of the inputs to each AND-gate.) Registers RX, RY, RZ, RV can be set or reset either synchronously or a synchronously through set port S or reset port R. (The choice of synchronous or asynchronous is made by a programmable memory cell shared between the two registers in each slice.) Set/reset input signals SR0, SR1 are controlled by multiplexers 60A, 60B and AND-gates 67A, 67B. Inputs SR0, SR1 (if enabled by AND-gates 67A, 67B) can set or reset the registers. Set/reset control units R81B, R82B, R81A, R82A are programmably controlled to either set or reset registers RX, RY, RZ, RV, respectively. Registers RX, RY, RZ, RV can also be configured as latches, the choice being made by a programmable memory cell shared between the two registers in each slice.

XOR gates SF, SG, SH, SJ generate the sum portion of an addition or multiplication, as described in commonly assigned, co-pending U.S. Patent application Ser. No. 08/754,421 entitled "Lookup Tables Which Double as Shift Registers", which is referenced above and incorporated herein by reference.

Multiplexers MF, MG, MH, MJ select between signals to place onto output lines X, Y, Z, V, respectively. Multiplexers MF and MH select between the related function generator output signal, sum output signal, and five-input function multiplexer output signal. Multiplexers MG and MJ select between the related function generator output signal, sum output signal, and six-input function multiplexer output signal. The function generator F, G, H, J output signal is selected when a logical function of up to four inputs is chosen. The five-input function multiplexer F5A, F5B output signal is selected when one of a limited set of nine-input functions is chosen, including any logical function of five inputs, a 4-to-1 multiplexer, and any other function that can be implemented as two four-input functions feeding a 2-to-1 multiplexer. The six-input function multiplexer F6A, F6B output signal is selected when one of a limited set of 18-input functions is chosen, including any logical function of six inputs, an 8-to-1 multiplexer, and any other function that can be implemented as the output of two five-input function multiplexers F5A, F5B feeding a 2-to-1 multiplexer. The sum output signal of XOR gates SF, SG, SH, SJ is selected when an appropriate arithmetic operation such as addition, subtraction or multiplication is implemented.

Multiplexers OF, OG, OH, OJ allow the carry chain to bypass the related function generator. Multiplexers OF, OG, OH, OJ select whether the respective carry multiplexer CF, CG, CH, CJ is controlled by the function generator output signal O or whether the carry chain bypasses the function generator by propagating the carry-in signal to the next stage along the carry chain. Multiplexers CA, CB allow additional access onto their respective carry chains by selecting either a carry-in signal CIN0, CIN1 (buffered in this embodiment by inverters I121B and I122B, I121A and I122A, respectively) or an input signal BF, BH as the starting point for the carry chain in the CLE.

Multiplexers DF, DH select a signal to be loaded into related registers RX, RZ either from the outputs of multiplexers MF, MH, or from input signals BF, BH, respectively. Multiplexers DG, DJ select a signal to be loaded into related registers RY, RV either from the outputs of multiplexers MG, MJ, or from input signal lines BG, BJ, respectively.

Multiplexers BB, BA are bypass multiplexers that can apply carry-out signals COUT0, COUT1 to output lines YB, VB, or can forward input signals BG, BJ to output lines YB, VB to route a signal generated on one side of the CLE to a destination on the other side of the CLE.

AND-gates BRB, BRA allow input signals BG, BJ to serve as set/reset signals to registers RX, RY, RZ, RV, or alternatively allows input signals BG, BJ to be decoupled from registers RX, RY, RZ, RV so that input signals BG, BJ can be used for other purposes, such as controlling multiplexers F6B, F6A or providing a DI signal to function generators G, J, without setting or resetting the registers. A logic 0 in the memory cells controlling AND-gates BRB, BRA decouples lines BG, BJ from set/reset control units R81B, R82B, R81A, R82A; while a logic 1 in the associated memory cell enables AND-gates BRB, BRA to use the signals on BG, BJ to set or reset registers RX, RY, RZ, RV as determined by set/reset control units R81B, R82B, R81A, R82A.

Input Multiplexer IMUX

FIG. 7 shows details of the interior of input multiplexer IMUX of the embodiment shown in FIG. 3. As shown in FIG. 7, the input lines in this embodiment (G, 430, DIW, 428, DIE, 429) are selectively programmed to drive a series of 34 outputs (431, 432, 436, LV0, LV6, LH0, LH6). 26 of these outputs drive CLE inputs 436, two drive the data inputs 431 and two drive the enable inputs 432 of tristate buffers 445, two drive LV0 and LV6 (two lines of vertical long line bus LVS), and two drive LH0 and LH6 (two lines of horizontal long line bus LHE). Not all inputs can drive all outputs; a selection of how many PIPs to provide and where they should be located is typically made based on the trade-off constraints of performance, silicon area, and routing flexibility. In one embodiment, any IMUX output not connected to any IMUX input line is connected through a pullup to the positive voltage supply.

Routing Examples

Figure 8:
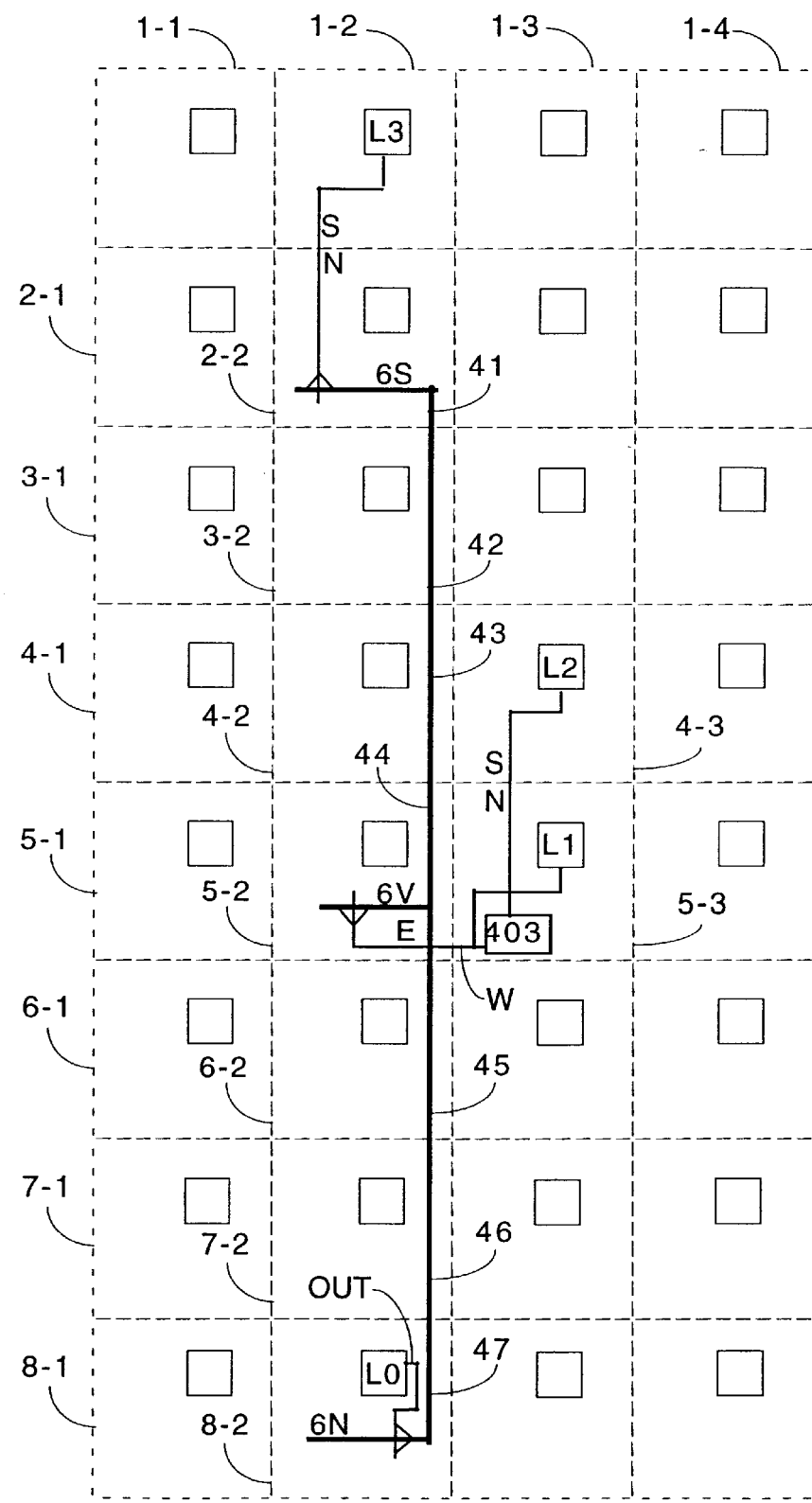
FIG. 8 shows a routing example of a signal path using hex and single-length lines.
Figure 9:
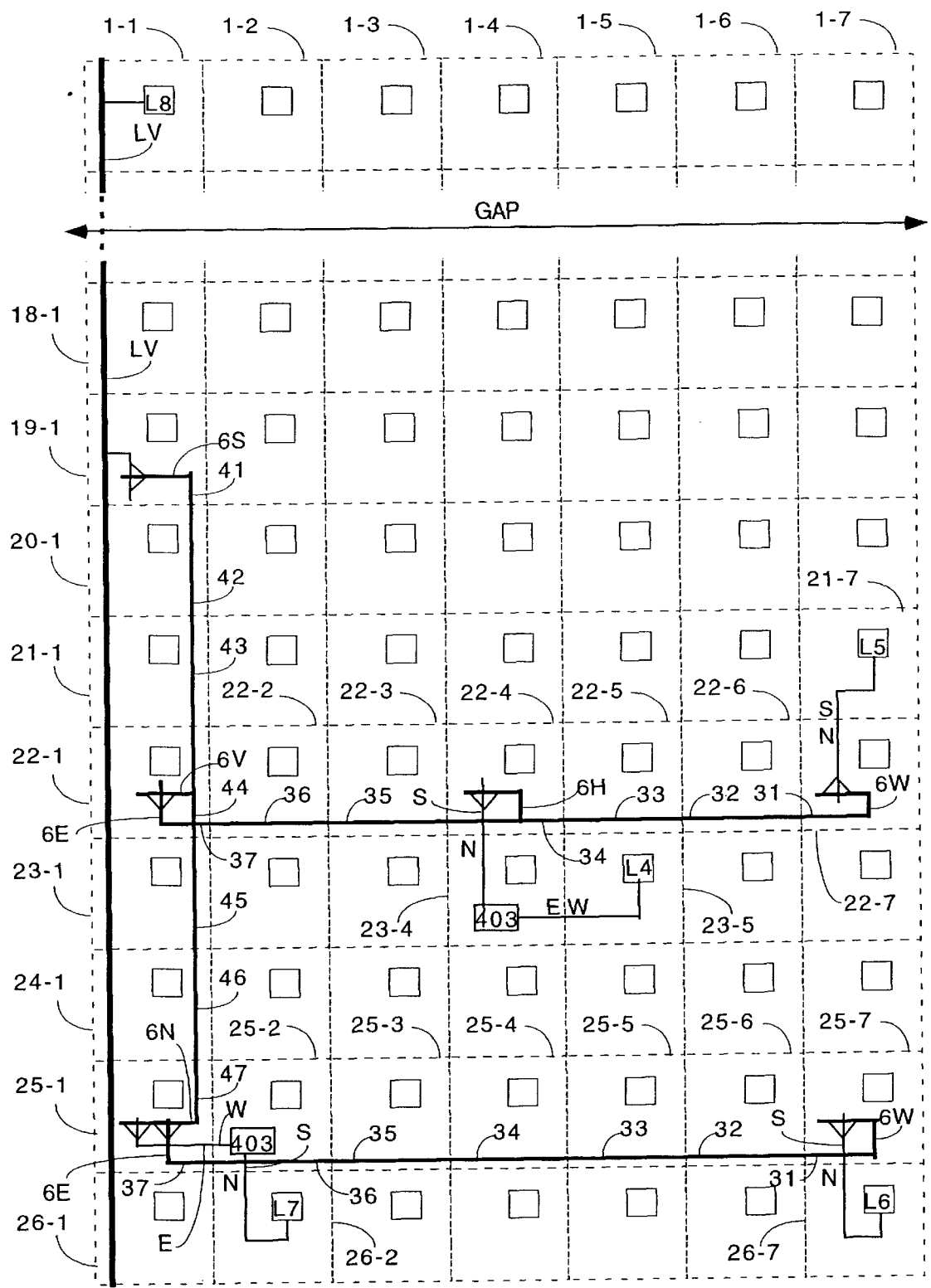
FIG. 9 shows a routing example of a signal path using long lines, hex lines, and single-length lines.

FIGS. 8 and 9 show examples of signal paths implemented in an array of tiles according to the embodiment shown in FIG. 3. The labeling convention used in FIGS. 8 and 9 is that tiles are identified by a row and column number based on the portion of the array shown in the figure. Within a tile the line labels correspond to the bus labels indicated in FIG. 2. However, in FIGS. 8 and 9, the label indicates a single line rather than the entire bus. Only lines used in the examples are shown and labeled. With this labeling convention, some labels are used more than once. But no ambiguity exists, because all tiles are identical and each tile has a different tile number. The tile numbers distinguish between labels used more than once in the same drawing.

FIG. 8 shows a routing example of a signal path using hex and single-length lines. A signal is sourced by source logic block LO of tile 8-2, and programmably connected within the tile through line OUT to hex segment 6N. Hex segment 6N turns north and becomes vertical hex segment 47. This signal must fan out to logic blocks at three destinations in tiles 5-3, 4-3, and 1-2. The signal passes through tiles 7-2 through 3–2 on segments 46 through 42. At tile 5-2, the signal is on segment 44, where it fans out to segment 6V. In tile 5-2, segment 6V is programmably connected to single-length line E, which continues east into tile 5–3 as line W. In tile 5-3, line W is an input to the first destination, logic block L1, and also to switching structure 403, where it is programmably connected to line N. Line N of tile 5-3 continues north into tile 4-3 as line S, which is an input to the second destination, logic block L2. The northern end of the vertical hex line is reached in tile 2-2, where the signal is on segment 41. Segment 41 is programmably connected to single-length line N, which continues north into tile 1-2 as line S. In tile 1-2, line S is an input to the third destination, logic block L3.

Thus in FIG. 8 a signal net is formed from source logic block LO to destination logic blocks L1, L2 and L3. The connections are fast because the PIP onto the hex line is buffered, there is a low capacitance on the hex line due to the small number of PIPs on the hex line, and each path from source to destination has a small total number of PIPs inserting delay into the signal path. In the example of FIG. 8, each signal path between source and destination logic blocks requires at most three PIPs: one buffered PIP onto the hex line and one or two unbuffered PIPs onto single-length lines. (A logic block is the structure designated LB in FIG. 2.)

FIG. 9 shows a routing example of a signal path using a long line, hex lines, and single-length lines. A signal is sourced by source logic block L8 of tile 1-1, and must be routed to logic blocks L4, L5, L6, and L7. The signal from logic block L8 is programmably connected within tile 1-1 to one of the vertical long lines LV accessible from that particular tile. Long line LV extends southward for 18 tiles to tile 19-1, where long line LV is programmably connected to hex segment 6S, then continues southward to drive other hex lines (not shown) south of the portion of the array shown in FIG. 9. (The gap of 18 tiles in FIG. 9 is included to demonstrate that long line LV must carry the signal far enough that a long line is more efficient than concatenated hex lines.) From hex segment 6S in tile 19–1, the signal turns south and becomes vertical hex segment 41. The signal passes through tiles 20-1 through 24-1 on segments 42 through 46. At tile 22-1, the signal is on segment 44, where it fans out to segment 6V and continues south to tile 25-1. From segment 6V in tile 22-1, the signal makes a programmable connection to segment 6E (demonstrating the connection of two perpendicular hex lines). The signal then moves east on segment 37, traversing tiles 22-2 through 22-6 on segments 36 through 32. At tile 22-4, the signal is on segment 34, where it fans out to segment 6H and continues east to tile 22-5. In tile 22-4, the signal makes a programmable connection between segment 6H and single-length line S, which continues south into tile 23-4 as line N. In tile 23-4, line N enters switching structure 403 and connects to line E, which continues east into tile 23-5 on line W, an input to the first destination, logic block L4. From segment 32 in tile 22-6, the signal continues east into tile 22-7 on segment 31, then turns north onto segment 6W. Segment 6W is programmably connected to line N, which continues north into tile 21-7 as line S and is an input to the second destination, logic block L5.

Returning to the vertical hex line, the signal on segment 46 in tile 24-14 1 continues south into tile 25-1 on segment 47, which turns west on segment 6N. From segment 6N in tile 25-1, the signal makes a programmable connection to segment 6E. The signal then moves east on segment 37, traversing tiles 25-2 through 25-6 on segments 36 through 32. From segment 32 in tile 25-6, the signal continues east into tile 25-7 on segment 31, then turns north onto segment 6W. Segment 6W is programmably connected to line S, which continues south into tile 26-7 as line N and is an input to the third destination, logic block L6. One further connection remains to be made. From the south end of the vertical hexline, in tile 25-1, the signal on segment 6V makes an additional programmable connection to line E. Line E continues east into tile 25-2 on line W. In tile 25-2, line W enters switching structure 403 and connects to line S, which continues south into tile 26-2 on line N, an input to the fourth destination, logic block L7.

Thus in FIG. 9 a signal net is formed from source logic block L8 to destination logic blocks L4, L5, L6 and L7. As in the example of FIG. 8, the connections to long lines and hex lines are buffered and the RC delay of the unbuffered connection is minimized. In this example, these destinations required at most four PIPs in the interconnect path between logic blocks: one or two buffered PIPs onto hex lines, and one or two unbuffered PIPs onto single-length lines. Yet 31 tiles were traversed between source logic block L8 and destination logic block L6.

In all of the above routing examples, alternative paths are available, many of which require more PIPs than the signal paths used in these examples. If some of the interconnect lines on one path are already used by other signals, an alternative path may be used.

High Fanout Routing Examples

Figure 10:
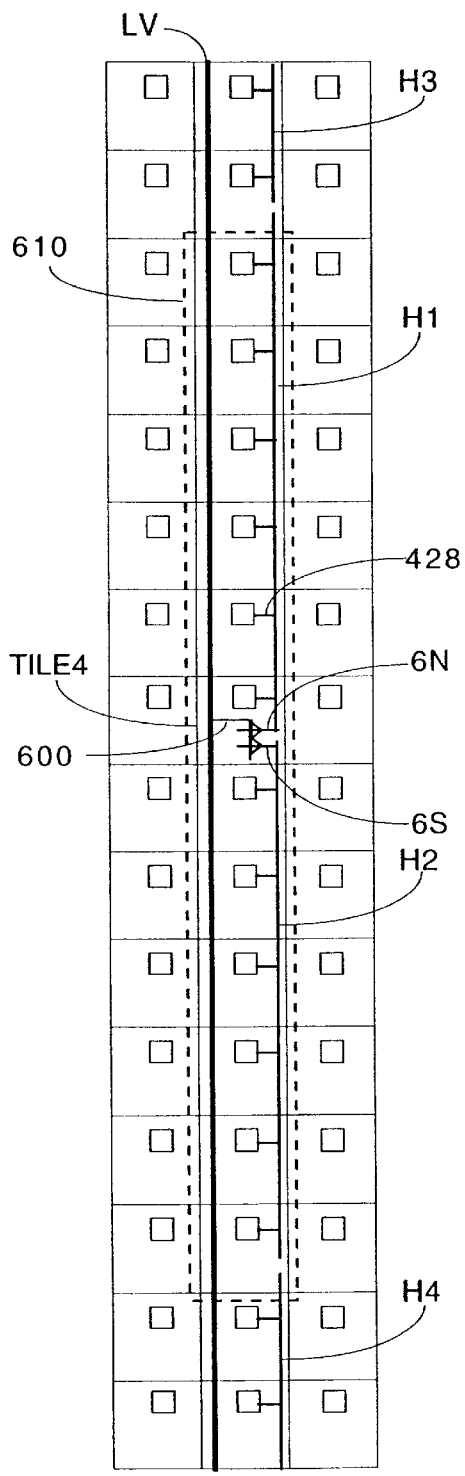
FIG. 10 shows a routing example of a high fanout control signal delivered to a column of tiles.

FIG. 10 shows a routing example of a high fanout control signal, such as a clock (CK), clock enable (CE), set/reset (SR), or tristate enable signal (432) delivered from a vertical long line to a column of tiles. A signal can be placed onto a vertical long line either from outside the tile array, or by using one of lines 437I of FIG. 2. From vertical long line bus LV, in every twelfth tile (TILE4) the high fanout control signal emerges on line 600. Line 600 drives two vertical hex lines, one of which (H1) extends north six tiles from TILE4 and one of which (H2) extends south six tiles from TILE4. From hex lines H1 and H2, lines 428 (shown in FIG. 2) permit four bits of each vertical hex bus to drive the logic block. The input multiplexer (IMUX) of FIG. 7 permits vertical hex lines, through lines 428, to drive control signals CK, CE, SR, and 432 without passing through a single-length line, although signals on other CLE inputs, such as function generator inputs, must always pass through a single-length line to reach the CLE. Hex line H1 drives the logic block in TILE4, plus the five tiles adjacent to the north. Note that in the northernmost tile reached by hex line H1, line 428 does not make contact with hex line H1. Instead, contact is made with hex line H3, which originates 12 tiles north of TILE4. Hex line H2 drives the six logic blocks adjacent to the south of TILE4. North of hex line H1, hex line H3 drives the adjacent six logic blocks. South of hex line H2, hex line H4 drives the adjacent six logic blocks. Each hex line drives a high fanout control signal in six logic blocks. The tiles accessed by hex lines H1 and H2 (labeled 610 in FIG. 10) form a column of 12 tiles that can be vertically repeated to access an entire column of an array of repeating tiles.

FIG. 10 shows that for a high fanout control signal, there is only one PIP between a signal on a vertical long line and any destination logic block in the same column. (However, in the preferred embodiment, there is an additional PIP added to the path in input multiplexer IMUX.) Therefore, there is very little delay on this path. Additionally, this distribution method has the same number of PIPs and the same number of interconnect lines (one long line, one hex line) in the path to each logic block input. Therefore, there is very low skew on this path. Although the global lines (G in FIG. 3) would typically be used for up to four clocks, the distribution method of FIG. 10, by taking advantage of the hierarchical nature of the interconnect scheme according to the invention, produces an excellent additional clock distribution network with high performance and low skew.

Figure 11:
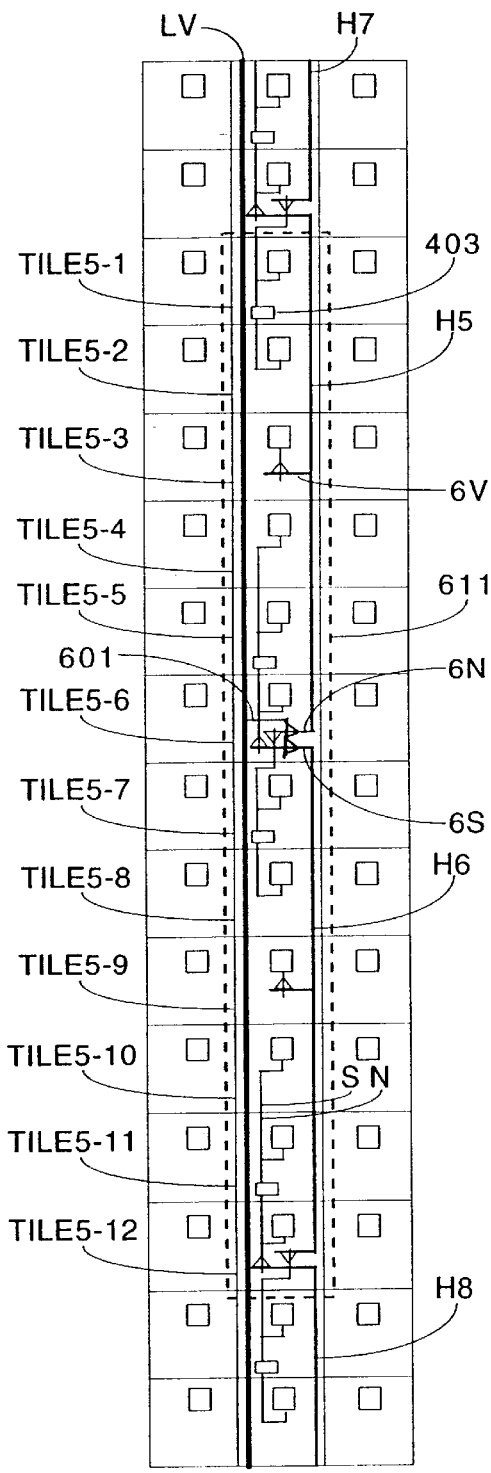
FIG. 11 shows a routing example of a high fanout function generator input signal delivered to a column of tiles.

FIG. 11 shows a routing example of a high fanout function generator input signal (or other non-control signal) delivered from a vertical long line to a column of tiles. A signal can be placed onto a vertical long line either from outside the tile array, or by using one of lines 437I of FIG. 2. From vertical long line bus LV, in every twelfth tile (TILE5-6) the high fanout function generator input signal emerges on line 601. Line 601 drives two vertical hex lines, one of which (H5) extends north six tiles from TILE4 and one of which (H6) extends south six tiles from TILE4. From hex lines H5 and H6, line segments 6S, 6N and 6V are used in conjunction with single-length lines N, S and switching structures 403 to drive the logic blocks, similar to the interconnections in FIGS. 8 and 9. In one embodiment, signals connecting to function generator inputs inside the CLE must always pass through a single-length line to reach the CLE. Hex line H5 drives, through single-length lines, the logic blocks in tiles TILE5-7, TILE5–8, and TILE5-3. In addition, hex line H5 drives, through single-length lines, the logic blocks in the three southernmost tiles of the 12-tile column to the north of column 611 (corresponding to tiles TILE5-10, TILE5-11, and TILE5-12 of column 611). Hex line H6 drives, through single-length lines, the logic blocks in tiles TILE5-4, TILE5-5, TILE5-6, and TILE5-9. In addition, hex line H6 drives, through single-length lines, the logic blocks in the two northernmost tiles of the 12-tile column to the south of column 611 (corresponding to tiles TILE5-1 and TILE5-2 of column 611). Tiles TILE5-1 and TILE5-2 are driven, through single-length lines, by hex line H7, which originates 12 tiles north of TILE5-6. Tiles TILE5-10, TILE5-11, and TILE5-12 are driven, through single-length lines, by hex line H8, which originates 12 tiles south of TILE5-6. Each hex line drives a high fanout function generator input signal in six logic blocks. Thus, by cooperation between adjacent 12-tile columns 611, a repeating pattern is formed that enables the distribution of non-control signals to an entire column of an array of repeating tiles.

Note that other connections of hex lines and single-length lines are possible. For example, the logic block in TILE5-2 can be driven by hex line 6V through a switching structure and single-length line in TILE5-3 (not shown) and hence through an additional switching structure and single-length line in TILE5-2 to drive the logic block in TILE5-1. This or a similar arrangement can be used in the northernmost implementation of 12-tile column 611, to access the two northernmost tiles. Similar connections can be made in the southernmost implementation of 12-tile column 611 to access the three southernmost tiles.

FIG. 11 shows that for a high fanout function generator input signal, there are either two or three PIPs between a signal on a vertical long line and any destination logic block in the same column: one from the long line to a hex line, one from the hex line to a first single-length line, and sometimes one to a second single-length line through the switching structure. (However, in the preferred embodiment, there is an additional PIP added to the path in input multiplexer IMUX.) Only the last one or two PIPs are unbuffered. Therefore, there are no large unbuffered RC trees on this net, no signal path has more than two unbuffered PIPs in series, and the delay on each signal path is minimized.

Figure 12:
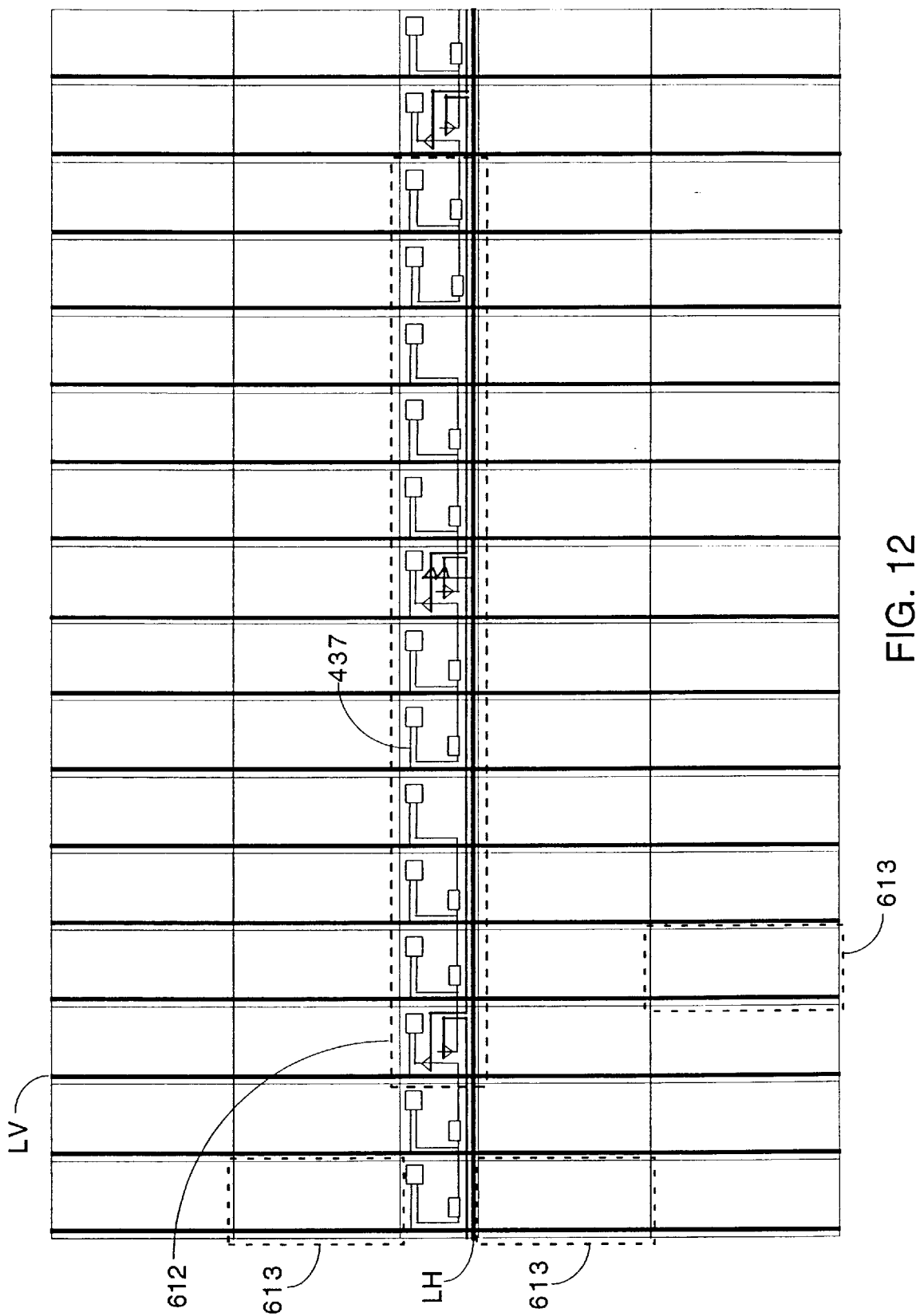
FIG. 12 shows an example of how to combine the interconnect of FIGS. 10 and/or 11 to deliver a high-fanout signal to an array of tiles.

FIG. 12 shows an example of how to combine the interconnect of FIGS. 10 and/or 11 to deliver a high-fanout signal to an array of tiles. A signal can be placed onto a horizontal long line either from outside the tile array, or by using one of lines 438 of FIG. 2. The signal enters the portion of the array shown in FIG. 12 on a line in horizontal long line bus LH. Long line bus LH traverses a row of 12 tiles 612, in which it makes contact with 12 logic blocks through hex lines and single-length lines. The horizontal single-length lines connected to some horizontal hex lines can drive vertical long lines through PIPs in the IMUX. From the logic blocks in the 12 tiles of FIG. 12, lines 437I extend from the input multiplexer (see FIG. 2) in the logic block to drive the vertical long lines LV. Using lines 437I in each of the 12 tiles 612, the signal on horizontal long line bus LH is transferred to 12 vertical long lines LV. Columns of 12 vertical tiles (613) can be implemented by either 12 tiles 610 of FIG. 10 (for control signals) or 12 tiles 611 of FIG. 11 (for function generator or other non-control inputs). Multiple 12-tile columns 613 can be placed to increase the number of accessible tiles. In this manner, high fanout signals can be distributed from an originating tile to any tile in the array.

As an alternative to the distribution scheme of FIG. 12, special tiles can be created that permit, for example, hex lines to drive long lines, thus bypassing the single-length lines used in FIG. 12. Such special tiles can be advantageously placed in rows along the top and bottom edges of the tile array, or at intervals within the array.

Summary

The interconnect structure of the present invention offers uniformly fast signals throughout the FPGA, due to the reduced loading (limited number of PIPs) on each interconnect line, the lack of large RC trees on signal nets, and the relatively small number of PIPs between source and destination on each path. The nearly uniform delays on various interconnect paths greatly mitigate a common situation in FPGAs where a few signal paths, much slower than the average signal path, significantly reduce the overall performance of the circuit. Intermediate-length lines enable the efficient implementation of localized circuits and ease the burden on routing software. The limited number of PIPs, and the judicious arrangement thereof, imparts a high degree of routing flexibility per silicon area consumed. Further routing flexibility is provided by the ability of logic block inputs to contact interconnect lines located on any edge of the logic block. Thus it will be understood that the present invention provides a new and useful interconnect structure for FPGAs.

Configuration Memory Cell Array

Figure 13A:
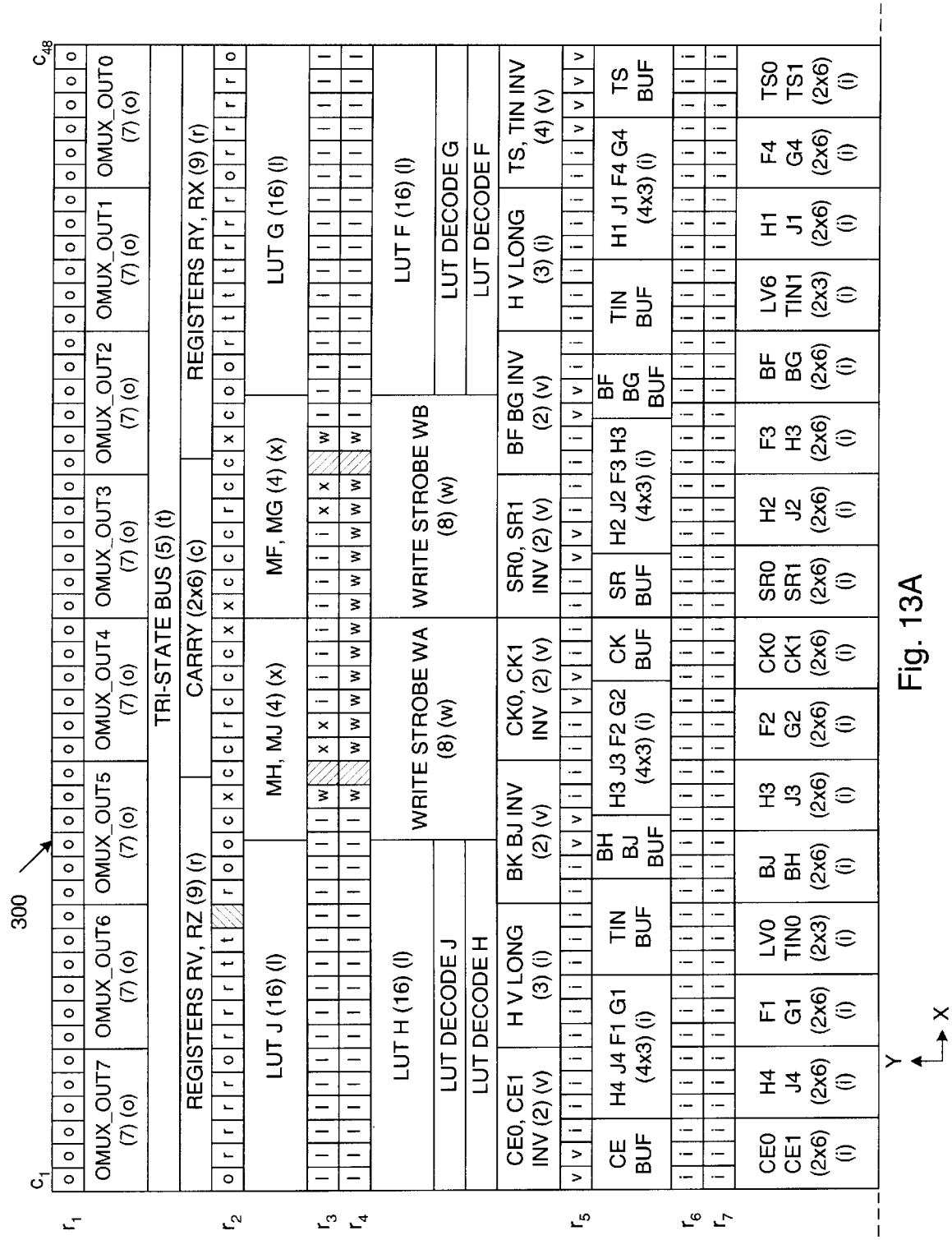
FIG. 13, which includes FIGS. 13A and 13B as illustrated, is a block diagram representative of the layout of the tile of FIG. 3 on silicon in accordance with one embodiment of the present invention.

FIG. 13, which includes FIGS. 13A and 13B as illustrated, is a block diagram representative of the layout of the tile 300 (FIG. 3) on silicon in accordance with one embodiment of the present invention. As described above, this tile 300 includes an output multiplexer (OMUX), a configurable logic element (CLE), an input multiplexer (IMUX) and an interconnect region (INTERCONNECT). All of the configurable elements of the tile are located in the OMUX, CLE, IMUX and INTERCONNECT blocks, with the exception of four unidirectional PIPs and one bi-directional PIP coupled to tri-state bus TW-TE (FIG. 3). FIG. 13 represents a rectangular silicon area having a width along the X-axis of 196.8 microns and a length along the Y-axis of 315 microns. As described in more detail below, this silicon area contains the OMUX, CLE, IMUX and INTERCONNECT circuitry, as well as the configuration memory cells that are programmed in order to configure the OMUX, CLE, IMUX and INTERCONNECT circuitry. In general, the configuration memory cells are logically arranged in an array having eighteen rows ($r_1$–$r_{18}$) and forty-eight columns ($c_1$–$c_{48}$). The OMUX, CLE, IMUX and INTERCONNECT circuitry is located between the various configuration memory cell rows $r_1$–$r_{18}$ as illustrated.

As described above, tile 300 also includes interconnect lines, including horizontal and vertical long lines, horizontal and vertical hex lines, single length lines, global lines, tri-state lines, data in and data out lines, and carry-in and carry-out lines (FIG. 3). These interconnect lines are generally located in a multi-level metal interconnect structure that extends over the silicon area illustrated by FIG. 13. These interconnect lines are not shown in FIG. 13 for purposes of clarity. The tile 300 of FIG. 13 will now be described in more detail.

OMUX Circuitry

The OMUX circuitry is located near the top of the tile, in the area occupied by the eight blocks labeled OMUX_OUT7-OMUX_OUT0. Each of the eight OMUX blocks includes a 12-to-1 multiplexer that is configured by seven corresponding configuration memory cells. These 12-to-1 multiplexers are illustrated in more detail in FIG. 5. Each horizontal line in FIG. 5 represents a 12-to-1 multiplexer. For example, the uppermost horizontal line, which provides the OUT7 signal, can be programmably connected to receive one of the following twelve signals: Z, V, ZQ, VQ, ZB, VB, 434, X, Y, XQ, YQ or YB. As is well known in the art, a 12-to-1 multiplexer can be implemented such that the output signal is selected in response to seven select signals. One example of a similar 16-to-1 multiplexer is found in commonly owned, co-pending U.S. patent application Ser. No. 09/102,711.

The block labeled OMUX_OUT7 corresponds to the 12-to-1 multiplexer that provides the OUT7 signal. Similarly, the blocks labeled OMUX_OUT6-OMUX_OUT0 correspond with 12-to-1 multiplexers that provide the OUT6-OUT0 signals, respectively. The notation "(7)" in these OMUX blocks indicates that there are seven configuration memory cells associated with each of the 12-to-1 multiplexers. These configuration memory cells store the configuration data values used to configure the 12-to-1 multiplexers. The notation "(o)" in the OMUX blocks indicates that the configuration memory cells used to configure the 12-to-1 multiplexers are labeled with the reference letter "o" in FIG. 13.

The eight 12-to-1 output multiplexers in the OMUX block are configured by 56 (7×8) configuration memory cells. These 56 configuration memory cells include those configuration memory cells that contain the reference letter "o". More specifically, these 56 configuration memory cells include all 48 configuration memory cells in row $r_1$, and 8 configuration memory cells in row $r_2$.

Tri-State Buffers

Tri-state buffers 445 (FIG. 3) of the tri-state bus are also located near the top edge of the tile 300. The connection of tri-state buffers 445 to tri-state bus TW-TE are controlled by four unidirectional PIPs (shown as triangles) and one bi-directional PIP (shown as a circle). Thus, five configuration memory cells are required to configure these PIPs. These five configuration memory cells, which are labeled with the reference letter "t", are located in row $r_2$ of the configuration memory cell array as illustrated. The tri-state buffers 445 are illustrated in FIG. 13 as the block labeled "Tri-State Bus (5)(t)", where (5) is the number of configuration memory cells required to configure the tri-state bus, and (t) is the reference letter used to identify these five configuration memory cells.

Configurable Logic Element

The configurable logic element (CLE) of FIGS. 6A and 6B is located below the OMUX circuitry and tri-state bus.

Registers

As described above, the CLE includes four registers RV, RZ, RY and RX. The initial state and operating mode of registers RV and RZ can be set by programming nine associated configuration memory cells. These nine configuration memory cells can be found in FIG. 6A as follows. Two configuration memory cells, for selecting synchronous operation or latch operation within the registers RV and RZ, are located on lines that extend between registers RV and RZ. Two additional configuration memory cells (not shown) are provided within registers RV and RZ for state capture. Two additional configuration memory cells are located in set/reset control units R82A and R81A. Two more configuration memory cells are provided to configure multiplexers DJ and DH. Finally, one configuration memory cell is located at an input terminal of AND gate BRA.

These nine configuration memory cells, which are labeled with the reference letter "r" in FIG. 13, are located in row $r_2$ of the configuration memory cell array as illustrated. Registers RV and RZ are illustrated in FIG. 13 as the block labeled "Registers RV, RZ (9) (r)", where (9) is the number of configuration memory cells required to configure the registers RV and RZ, and (r) is the reference letter used to identify these nine configuration memory cells.

Similarly, the initial states and operating modes of registers RY and RX can each be set by programming nine configuration memory cells. These nine configuration memory cells are found in FIG. 6B. These configuration memory cells are also labeled with the reference letter "r" in FIG. 13. The eighteen (9+9) configuration memory cells used to configure registers RV, RZ, RY and RX are located in row $r_2$ of the configuration memory cell array.

Carry Logic

In addition, the CLE includes a first set of carry logic multiplexers CA, 81H, 81J, OH, OJ and BA that are configured to establish a first carry logic chain in the CLE. The CLE further includes a second set of carry logic multiplexers CB, 81F, 81G, OF, OG and BB that are configured to establish a second carry logic chain in the CLE. Each set of carry logic multiplexers is configured in response to the configuration data values stored in six configuration memory cells. (Note that multiplexers 81H and 81J are actually configured by the same two configuration memory cells, and not by four configuration memory cells as suggested in FIG. 6A. Similarly, multiplexers 81F and 81G are configured by the same two configuration memory cells). The carry logic multiplexers are illustrated in FIG. 13 as the block labeled "CARRY (2×6)(c)", where (2×6) is the number of configuration memory cells required to configure the carry logic multiplexers, and (c) is the reference letter used to identify these (2×6) configuration memory cells. The twelve (2×6) configuration memory cells used to configure the two sets of carry logic are located in row $r_2$ of the configuration memory cell array as illustrated.

Look-Up Tables

The CLE further includes four look-up tables LUT H, LUT J, LUT G and LUT F, which can be configured within function generators H, J, G, and F, respectively. Each of these look-up tables is configured in response to 16 configuration memory cells. The look-up tables are illustrated in FIG. 13 as the blocks labeled "LUT H(16)(l)" "LUT J(16)(l)" "LUT G(16)(l)" and "LUT F(16)(l)", where (16) is the number of configuration memory cells required to configure each look-up table, and (l) is the reference letter used to identify these configuration memory cells. The 48 (4×16) configuration memory cells used to configure the look-up tables LUT H, LUT J, LUT G and LUT F are located in rows $r_3$ and $r_4$ of the configuration memory cell array as illustrated. The CLE further includes four look-up table decoders LUT DECODE J, LUT DECODE H, LUT DECODE F and LUT DECODE G. These look-up table decoders are located as illustrated in FIG. 13. There are no configuration memory cells required to configure these look-up table decoders.

Multiplexers MH, MJ, MF and MG

The CLE further includes multiplexers MH, MJ, MF and MG (FIGS. 6A and 6B). Each of these multiplexers MH, MJ, MF and MG is configured in response to the configuration data values stored in two associated configuration memory cells. Multiplexers MH and MJ are illustrated in FIG. 13 as the block labeled "MH, MJ(4)(x)" where (4) is the number of configuration memory cells required to configure multiplexers MH and MJ, and (x) is the reference letter used to identify these configuration memory cells. Similarly, Multiplexers MF and MG are illustrated in FIG. 13 as the block labeled "MF, MG(4)(x)". The 8 (2×4) configuration memory cells used to configure multiplexers MH, MJ, MF and MG are located in rows $r_2$ and $r_3$ of the configuration memory cell array as illustrated.

Write Strobe Generators

The CLE further includes write strobe generators WA and WB, which generate write strobe signals in the manner described above. Each of write strobe generators WA and WB is configured in response to configuration data values stored by eight associated configuration memory cells. The configuration memory cells used to configure write strobe generator WA are found in FIG. 6A as follows. Five of the configuration memory cells are located within write strobe generator WA, two configuration memory cells are located at the input terminals of AND gates 62A and 67A, and one configuration memory cell is located at the control terminal of multiplexer 65A. The configuration memory cells used to configure write strobe generator WB are similarly found in FIG. 6B.

Write strobe generators WA and WB are illustrated in FIG. 13 as the blocks labeled "Write Strobe WA(8)(w)" and "Write Strobe WB(8) (w)", where (8) is the number of configuration memory cells required to configure each of the write strobe generators WA and WB, and (w) is the reference letter used to identify these configuration memory cells. The 16 (2×8) configuration memory cells used to configure write strobe generators WA and WB are located in rows $r_3$ and $r_4$ of the configuration memory cell array as illustrated.

Inverse Multiplexers

In addition, the CLE includes ten inverting multiplexers 60A, 66A, 69A, VH, VJ, 60B, 66B, 69B, VF and VG that can be configured to either route a signal or the inverse of the signal into the CLE. Each of these ten inverting multiplexers is configured in response to a configuration data value stored in an associated configuration memory cell. These inverting multiplexers are illustrated as pairs in FIG. 13 in the blocks labeled "CE0 CE1 INV(2)(v)", "BK BJ INV(2)(v)", "CK0 CK1 INV(2)(v)", "SR0 SR1 INV(2)(v)", and "BF BG INV(2)(v)", where (2) is the number of configuration memory cells required to configure each pair of inverting multiplexers, and (v) is the reference letter used to identify these configuration memory cells. The ten (5×2) configuration memory cells used to configure the ten inverting multiplexers are located in row $r_5$ of the configuration memory cell array as illustrated.

CLE Buffers

The CLE further includes non-configurable buffers for the clock enable signals (CE BUF), the clock signals (CK BUF), the set/reset signals (SR BUF), the data input signals (BH BJ BUF and BF BG BUF).

Tri-State Buffers

Tri-state buffers 445 (FIG. 3) further include non-configurable buffers for the tri-state input signals (TIN BUF) and the tri-state control signals (TS BUF). In addition, tri-state buffers 445 include four inverting multiplexers (not shown) that can be configured to either route a signal or the inverse of the signal into the four inputs of tri-state buffers 445. Each of these four inverting multiplexers is configured in response to a configuration data value stored in an associated configuration memory cell. These inverting multiplexers are illustrated in FIG. 13 in the block labeled "TS, TIN INV (4)(v), where (4) is the number of configuration memory cells required to configure the four inverting multiplexers, and (v) is the reference letter used to identify these configuration memory cells. The four configuration memory cells used to configure the four inverting multiplexers are located in row $r_5$ of the configuration memory cell array as illustrated.

Input Multiplexer (IMUX)

The IMUX circuitry of FIG. 7 is located below the CLE circuitry in the tile of FIG. 13. The IMUX circuitry includes one non-configurable buffer (not shown) to drive each of the single length lines S, W, E and N, for a total of 96 IMUX buffers. In addition, the IMUX circuitry of FIG. 7 includes thirty-four multiplexers, which are represented by the thirty four uppermost horizontal lines in FIG. 7.

For example, the uppermost (i.e., the first) horizontal line in FIG. 7, which provides a tri-state enable signal (TS0) to one of the tri-state buffers 445 (FIG. 3), can be configured to receive one of sixteen signals (as indicated by the triangles on the first horizontal line). The first horizontal line in FIG. 7 therefore represents a 16-to-1 multiplexer. This 16-to-1 multiplexer selects one of the sixteen input signals in response to the configuration data values stored in 6 corresponding configuration memory cells. As is well known in the art, a three-level 16-to-1 multiplexer can be implemented such that the output signal is selected in response to six select signals.

Similarly, the third horizontal line in FIG. 7, which provides a tri-state enable signal (TS1) to the other one of the tri-state buffers 445, can be configured to receive one of sixteen signals. The third horizontal line therefore represents another 16-to-1 multiplexer. This 16-to-1 multiplexer is a three-level multiplexer that selects one of the sixteen input signals in response to the configuration data values stored in 6 corresponding configuration memory cells.

The block labeled "TS0 TS1 (2×6)(i)"in FIG. 13 corresponds to the two 16-to-1 multiplexers that provide the TS0 and TS1 signals. These two IMUX multiplexers are configured by twelve (2×6) configuration memory cells. These twelve configuration memory cells include twelve of the configuration memory cells that are labeled with the reference letter "i" in FIG. 13 (See, rows $r_5$–$r_9$).

The second and fourth horizontal lines in FIG. 7 are each 8-to-1 multiplexers that provide tri-state data input signals TIN0 and TIN1, respectively, to tri-state buffers 445. The fifth and sixth horizontal lines in FIG. 7 are each 8-to-1 multiplexers that route signals from the single length lines to the vertical long lines LV0 and LV6, respectively. Each of these 8-to-1 multiplexers is configured by three configuration data values (which are stored in three corresponding configuration memory cells). The block labeled "LV0 TIN0 (2×3)(i)" in FIG. 13 corresponds to the 8-to-1 multiplexers associated with the fifth and second horizontal lines. Similarly, the block labeled "LV1 TIN1(2×3)(i)" in FIG. 13 corresponds to the 8-to-1 multiplexers associated with the sixth and fourth horizontal lines.

Table 1 summarizes the configuration of the 34 multiplexers in the IMUX.

TABLE 1

| Horiz. Line in FIG. 7 (# from top) | Signal Supplied to CLE | Mux Size | # of Config. Bits | Associated Block(s) (FIG. 13) |
|---|---|---|---|---|
| 1  | TS0  | 16:1 | 6     | TS0 TS1 |
| 2  | TIN0 | 8:1  | 3     | LV0 TIN0 |
| 3  | TS1  | 16:1 | 6     | TS0 TS1 |
| 4  | TIN1 | 8:1  | 3     | LV6 TIN1 |
| 5  | LV0  | 8:1  | 3     | LV0 TIN0 |
| 6  | LV6  | 8:1  | 3     | LV6 TIN1 |
| 7  | J4   | 26:1 | 6 + 3 | H4 J4 + H4 J4 F1 G1 |
| 8  | J3   | 26:1 | 6 + 3 | H3 J3 + H3 J3 F2 G2 |
| 9  | J2   | 26:1 | 6 + 3 | H2 J2 + H2 J2 F3 G3 |
| 10 | J1   | 26:1 | 6 + 3 | H1 J1 + H1 J1 F4 G4 |
| 11 | BJ   | 16:1 | 6     | BJ BH |
| 12 | BH   | 16:1 | 6     | BJ BH |
| 13 | H4   | 26:1 | 6 + 3 | H4 J4 + H4 J4 F1 G1 |
| 14 | H3   | 26:1 | 6 + 3 | H3 J3 + H3 J3 F2 G2 |
| 15 | H2   | 26:1 | 6 + 3 | H2 J2 + H2 J2 F3 G3 |
| 16 | H1   | 26:1 | 6 + 3 | H1 J1 + H1 J1 F4 G4 |
| 17 | CE1  | 16:1 | 6     | CE0 CE1 |
| 18 | CK1  | 16:1 | 6     | CK0 CK1 |
| 19 | SR1  | 16:1 | 6     | SR0 SR1 |
| 20 | G4   | 26:1 | 6 + 3 | F4 G4 + H1 J1 F4 G4 |
| 21 | G3   | 26:1 | 6 + 3 | F3 G3 + H2 J2 F3 G3 |
| 22 | G2   | 26:1 | 6 + 3 | F2 G2 + H3 J3 F2 G2 |
| 23 | G1   | 26:1 | 6 + 3 | F1 G1 + H4 J4 F1 G1 |
| 24 | BG   | 16:1 | 6     | BF BG |
| 25 | BF   | 16:1 | 6     | BF BG |
| 26 | F4   | 26:1 | 6 + 3 | F4 G4 + H1 J1 F4 G4 |
| 27 | F3   | 26:1 | 6 + 3 | F3 G3 + H2 J2 F3 G3 |
| 28 | F2   | 26:1 | 6 + 3 | F2 G2 + H3 J3 F2 G2 |
| 29 | F1   | 26:1 | 6 + 3 | F1 G1 + H4 J4 F1 G1 |
| 30 | CE0  | 16:1 | 6     | CE0 CE1 |
| 31 | CK0  | 16:1 | 6     | CK0 CK1 |
| 32 | SR0  | 16:1 | 6     | SR0 SR1 |
| 33 | LH0  | 2:1  | 1     | H V LONG |
| 34 | LH6  | 2:1  | 1     | H V LONG |

Note that the 26:1 multiplexers associated with J1–J4, H1–H4, F1–F4 and G1–G4 are each controlled by nine configuration memory cells. For example, the 26:1 multiplexer associated with signal J4 is controlled by six configuration memory cells located in the block labeled "H4 J4(2×6)(i)" and three configuration memory cells located in the block labeled "H4 J4 F1 G1 (4×3)(i)".

The last two horizontal lines in FIG. 7 are each 2-to-1 multiplexers that route signals from OMUX (i.e., lines 429) to the horizontal long lines LH0 and LH6, respectively. Each of the blocks labeled "H V LONG(3)(i)" in FIG. 13 corresponds to one of these 2-to-1 multiplexers. Each of the blocks labeled "H V LONG(3)(i)" additionally corresponds to one tri-state buffer associated with a horizontal long line (i.e., LH0 or LH6) and one tri-state buffer associated with a vertical long line (i.e., LV0 or LV6). Each of the blocks labeled "H V LONG(3)(i)" has three associated configuration memory cells (one for controlling the associated 2-to-1 multiplexer, one for enabling/disabling the tri-state buffer associated with the corresponding horizontal long line, and one for enabling/disabling the tri-state buffer associated with the vertical long line.)

Interconnect Circuitry (INTERCONNECT)
Single-to-Single PIPs

The INTERCONNECT circuitry of FIG. 4 is located below the IMUX circuitry in the tile layout of FIG. 13. The INTERCONNECT circuitry includes 144 PIPs to connect single length lines to single length lines in switching structure 403. These PIPs are illustrated in a dedicated block labeled "Single-to-Single PIPs (144)(s)" in FIG. 13. Each of the 144 PIPs has a corresponding configuration memory cell that is programmed with a configuration data value to configure the PIP. These 144 configuration memory cells are labeled with the reference letter "s" in FIG. 13.

Hex-to-Single PIPs

The INTERCONNECT circuitry further includes 112 PIPs that are programmable to couple hex lines to single length lines. These 112 PIPs are shown as triangles located at the intersections of the single length lines and the hex lines in FIG. 4. These 112 PIPs are illustrated in a block labeled "Hex-to-Single PIPs (112)(h)" in FIG. 13. Each of these 112 PIPs has a corresponding configuration memory cell that is programmed with a configuration data value to configure the PIP. These 112 configuration memory cells are labeled with the reference letter "h" in FIG. 13.

Output-to-Single PIPs

In addition, the INTERCONNECT includes 48 PIPs for coupling output lines OUT0-OUT7 to single length lines. These 48 PIPs are shown as triangles located at the intersections of the output lines OUT0-OUT7 and the single length lines in FIG. 4. These 48 PIPs are illustrated in a block labeled "Output-to-Single PIPs (48)(n)" in FIG. 13. Each of these 48 PIPs has a corresponding configuration memory cell that is programmed with a configuration data value to configure the PIP. These 48 configuration memory cells are labeled with the reference letter "n" in FIG 13.

Unidirectional and Bi-directional Buffers and PIPs

Moreover, the INTERCONNECT includes unidirectional tri-state hex buffers and bi-directional hex buffers 404 and 405. The sixteen bi-directional hex buffers are configured by 16 configuration memory cells. The unidirectional and bi-directional buffers are illustrated in a block labeled "Uni Tri-State Hex Buffers, 16 Bi Hex Buffers (16)(b)" in FIG. 13. Each of the 16 configuration memory cells is labeled with the reference letter "b" in FIG. 13.

Long Line and Hex Line Multiplexers

Finally, the INTERCONNECT circuitry includes thirty-two 6-to-1 multiplexers for coupling to the horizontal hex lines, vertical hex lines, horizontal long lines and vertical long lines. These thirty-two multiplexers are located as follows in FIG. 4. By examining the twelve hex lines 6NL-6NR, it is seen that eight of these hex lines 6NL-6NR are configured as 6-to-1 multiplexers (i.e., these hex lines can be selectively coupled to one of six lines). Similarly, eight of the twelve hex lines 6SL-6SR are configured as 6-to-1 multiplexers, eight of the twelve hex lines 6W are configured as 6-to-1 multiplexers, and eight of the twelve hex lines 6E are configured as 6-to-1 multiplexers. Pairs of these 6-to-1 multiplexers are illustrated in FIG. 13 as blocks "6:1 MUX(2×3)(m)". Each 6-to-1 multiplexer is configured in response to three configuration bits. Thus, 96 (3×32) configuration memory cells are provided to store the configuration data values required to configure the thirty-two 6-to-1 multiplexers. These 96 configuration memory cells are labeled with the reference letter "m" in FIG. 13.

Advantages of Tile Organization

In the foregoing manner, the tile is organized in a uniform rectangular area on a silicon substrate. The configuration memory cells are generally located adjacent to the elements that they control. For example, the configuration memory cells for configuring the 6-to-1 multiplexers are located adjacent to the 6-to-1 multiplexers. Moreover, the configuration memory cells for controlling the configuration of the INTERCONNECT circuitry are located near the bottom edge of the rectangular area.

In addition, the tile is organized such that the circuitry required for implementing the INTERCONNECT circuitry is organized in rectangular blocks. For example, the INTERCONNECT circuitry for coupling to the horizontal hex lines, vertical hex lines, horizontal long lines and vertical long lines includes the thirty-two 6-to-1 multiplexers located in a rectangular area at the bottom of the tile. As described in more detail below, this organization enables interconnect structure to be added or removed from the tile without significantly impacting the remaining layout of the tile. As also described in more detail below, this tile structure enables interconnect structure to be added or removed from the tile in a manner that enables configuration bit stream compatibility between various tile structures.

As is well known in the art, the tile of FIG. 13 is programmed by shifting configuration values from a configuration bit stream into the configuration memory cells. These configuration values are typically shifted into the tile one column at a time. Thus, the configuration data bits for column $c_1$ are simultaneously shifted into rows $r_1$–$r_{18}$. The reference letters of these configuration data bits exhibit the following pattern: "o o l l v i i i i s s s n h h h m m". After the configuration data bits for column $c_1$ have been loaded, the configuration data bits for column $c_2$ are loaded. This process continues until all of the configuration memory cells are loaded with the desired configuration data values.

Note that eighteen configuration data values are shifted into the tile at a time. The process of shifting configuration data values into the configuration memory cells is described in more detail in commonly owned, co-pending U.S. patent application Ser. No. 09/128,735.

Figure 14A:
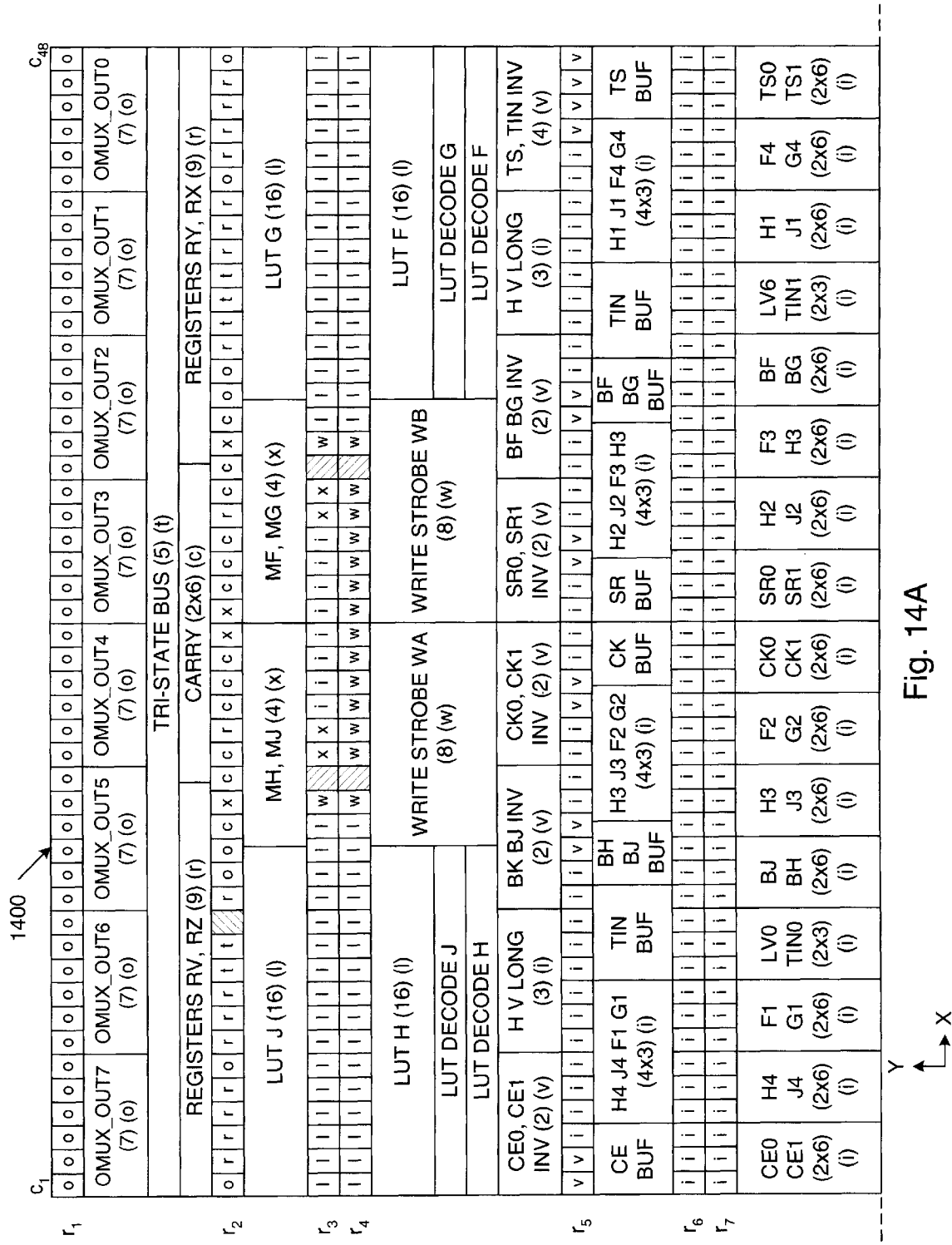
FIG. 14, which consists of FIGS. 14A and 14B as illustrated, is a block diagram representative of the layout of a tile having an increased interconnect structure in accordance with one embodiment of the present invention.

FIG. 14, which consists of FIGS. 14A and 14B as illustrated, is a block diagram representative of the layout of a tile 1400 on silicon in accordance with one embodiment of the present invention. Tile 1400 is similar to tile 300. However, tile 1400 has been modified to eliminate the unidirectional hex lines from tile 300. As a result, the unidirectional tri-state hex buffers are eliminated. In addition, interconnect circuitry associated with the unidirectional hex lines is eliminated. For example, in the absence of the unidirectional hex lines, there are only 48 PIPs required to provide programmable connections between the bi-directional hex lines and the single length lines (FIG. 4). As a result, row $r_{15}$ of tile 300 is not required in tile 1400. In addition, row $r_{16}$ of tile 300 is no longer required to store configuration data values for configuring hex-to-single PIPs.

Moreover, in the absence of the unidirectional hex lines, only sixteen 6-to-1 multiplexers are required to provide programmable connections between the horizontal and vertical bi-directional hex lines, the vertical long lines and the horizontal long lines. As a result, sixteen 6-to-1 multiplexers can be eliminated from tile 300. In addition, row $r_{17}$ of tile 300 is not required in tile 1400.

The elements eliminated from tile 300 represent a rectangular area within tile 300. As a result, the elimination of these elements does not significantly impact the layout of the resulting tile 1400. That is, to create tile 1400 from tile 300, a rectangular area of tile 300 is simply removed. In this manner, tile 300 can be efficiently shrunken to form a smaller tile.

After re-numbering, there are sixteen rows of configuration memory cells $r_1$–$r_{14}$, $r_{15}'$–$r_{16}'$ in tile 1400. The dimensions of tile 1400 are 196.8 microns along the X-axis and 266 microns along the Y-axis. Tile 1400 therefore has the same dimensions along the X-axis as tile 300. However, tile 1400 is shorter than tile 300 along the Y-axis. The configuration bit streams used to program tiles 300 and 1400 are compatible. That is, the configuration bit stream used to configure tile 1400 can also be used to configure tile 300. This configuration bit stream compatibility can be described using the following example.

To configure column $c_1$ of tile 1400, the configuration data bits for column $c_1$ are simultaneously shifted into rows $r_1$–$r_{14}$, $r_{15}'$–$r_{16}'$. The reference letters of these configuration data bits exhibit the following pattern: "o o l l v i i i i s s s n h - m", where "-" is equal to a "don't care" value.

Tile 300 can be configured using the configuration bit stream for tile 1400, as long as configuration circuitry for tile 300 is configured to receive a configuration bit stream normally intended for a 16-row tile. This information can be imparted by a header that precedes the configuration bit stream. In this case, the configuration circuitry is controlled to automatically insert two rows of "don't program" (dp) values into the sixteen configuration data bits. In the present example, the configuration circuitry is controlled to insert "don't program" (dp) values at the 15th and 17th row locations. Thus, configuration circuitry is controlled to automatically provide the following 18-bit pattern in response to the 16-bit pattern configuration data bits applied to tile 1400: "o o l l v i i i i s s s n h dp h dp m". As a result, tile 300 is configured to implement the same circuit as tile 1400.

Figure 15A:
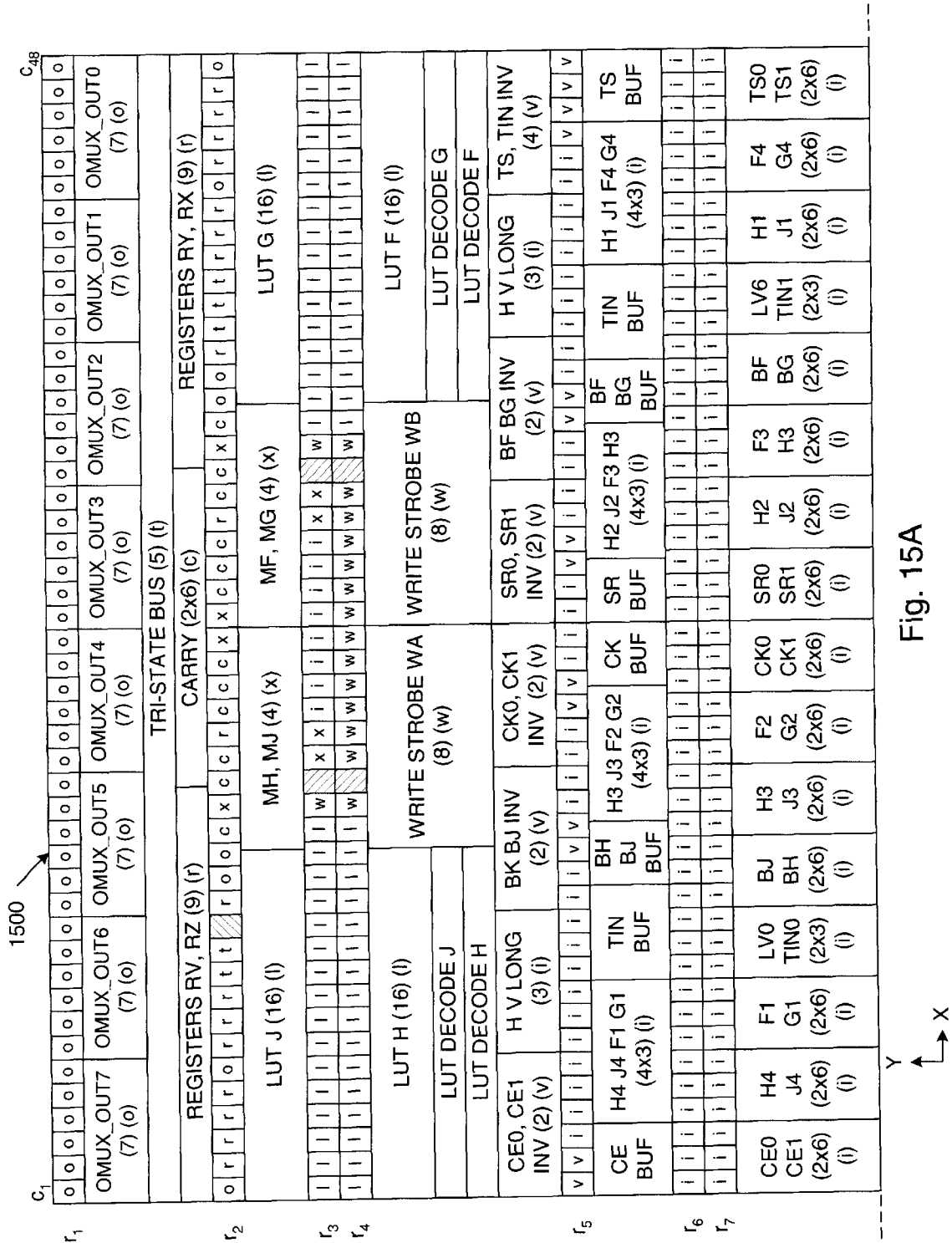
FIG. 15, which consists of FIGS. 15A and 15B as illustrated, is a block diagram representative of the layout of a tile having a reduced interconnect structure in accordance with one embodiment of the present invention.

FIG. 15, which consists of FIGS. 15A and 15B as illustrated, is a block diagram representative of the layout of a tile 1500 on silicon in accordance with one embodiment of the present invention. Tile 1500 is similar to tile 300. However, tile 1500 has been modified to add eight unidirectional hex lines to each of the hex buses. Sixteen additional unidirectional tri-state hex buffers are provided to support these additional unidirectional hex lines, thereby bringing the total number of unidirectional tri-state hex buffers to thirty-two. More specifically, eight additional unidirectional tri-state buffers are added to each of hex buffer circuits 405 and 406 (FIG. 4). Moreover, 64 additional hex-to-single PIPS are provided to supply the appropriate programmable connections between the new unidirectional hex lines and the single length lines. These 64 additional PIPs are provided by adding another row of configuration memory cells between rows $r_{15}$ and $r_{16}$ of tile 300, and fully using the available configuration memory cells in row $r_{16}$ of tile 300. The added row of configuration memory cells is labeled row $r_{16}"$ in FIG. 15B. The row previously labeled as row $r_{16}$ in tile 300 is re-labeled as row $r_{17}"$ in tile 1500.

Moreover, the additional unidirectional hex lines necessitate sixteen additional 6-to-1 multiplexers and 48 additional corresponding configuration memory cells. These additional 6-to-1 multiplexers and configuration memory cells are located between rows $r_{16}$ and $r_{17}$ of tile 300. The additional row of 48 configuration memory cells is labeled as row $r_{18}"$ in FIG. 15. Rows $r_{17}$ and $r_{18}$ of tile 300 are re-labeled as rows $r_{19}"$ and $r_{20}"$ in tile 1500.

The elements added to tile 300 in order to create tile 1500 represent a rectangular area. As a result, the addition of these elements does not significantly impact the layout of the resulting tile 1500. That is, to create tile 1500 from tile 300, a rectangular area is simply added to tile 300. In this manner, tile 300 can be efficiently expanded to form a larger tile.

After re-numbering, there are twenty rows of configuration memory cells $r_1$–$r_{15}$, $r_{16}"$$r_{20}"$ in tile 1500. The dimensions of tile 1500 are 196.8 microns along the X-axis and 340 microns along the Y-axis. Tile 1500 therefore has the same dimensions along the X-axis as tiles 300 and 1400. However, tile 1500 is longer than both tiles 300 and 1400 along the Y-axis.

The configuration bit streams used to program tiles 300, 1400 and 1500 are compatible. That is, configuration bit streams used to configure tiles 300 and 1400 can be used to configure tile 1500. To accomplish this, "don't program" (dp) bits are added to the configuration bit stream in the same manner described above.

Those having skill in the relevant arts of the invention will now perceive various modifications and additions that may be made as a result of the disclosure herein of the preferred embodiment. Accordingly, all such modifications and additions are deemed to be within the scope of the invention, which is to be limited only by the appended claims and their equivalents.

I claims:

1. A field programmable gate array (FPGA) including an array of rectangular configurable tiles, wherein each of the tiles comprises:
   a configurable interconnect structure for interconnecting the tiles;
   a first set of programmable interconnect points (PIPs) for configuring a first portion of the interconnect structure; and
   a first set of configuration memory cells for storing configuration data values used to program the first set of PIPs, wherein the first set of PIPs and the first set of configuration memory cells occupy a rectangular area within the tile.

2. The FPGA of claim 1, wherein the rectangular area has a width equal to a width of the tile.

3. The FPGA of claim 1, wherein the rectangular area borders on an edge of the tile.

4. The FPGA of claim 1, wherein the first portion of the configurable interconnect structure comprises a plurality of intermediate length lines.

5. The FPGA of claim 1, wherein the first portion of the configurable interconnect structure comprises a plurality of long lines that extend along a full width of the array.

6. The FPGA of claim 1, wherein the first set of PIPs comprise a plurality of multiplexers.

7. The FPGA of claim 1, wherein each of the tiles further comprises a configurable logic element.

8. The FPGA of claim 1, further comprising
   a second set of programmable interconnect points (PIPs) for configuring a second portion of the interconnect structure; and
   a second set of configuration memory cells for storing configuration data values used to program the second set of PIPs, wherein the second set of PIPs and the second set of configuration memory cells occupy a rectangular area within the tile.

9. The FPGA of claim 1, further comprising:
   configurable logic circuitry; and
   an array of configuration memory cells for storing configuration data values used to configure the configurable logic circuitry and the configurable interconnect structure, wherein the first set of configuration memory cells occupies a rectangular area in the array of configuration memory cells, the rectangular area extending the entire width of the array of configuration memory cells.

10. A method of expanding a configurable interconnect structure of a field programmable gate array (FPGA) having an array of rectangular configurable tiles, the method comprising the steps of:

adding a first set of configurable interconnect resources to each of the tiles;

adding a first set of programmable interconnect points (PIPs) to each of the tiles, wherein the first set of PIPs configures the first set of configurable interconnect resources; and adding a first set of configuration memory cells to each of the tiles, wherein the configuration memory cells store configuration data values used to program the first set of PIPs; and organizing the first set of PIPs and the first set of configuration memory cells to occupy a rectangular area within each of the tiles.

11. A method of reducing a configurable interconnect structure of a field programmable gate array (FPGA) having an array of rectangular configurable tiles, the method comprising the steps of:

removing a first set of configurable interconnect resources from each of the tiles;

removing a first set of programmable interconnect points (PIPs) from each of the tiles, wherein the first set of PIPs configure the first set of configurable interconnect resources; and removing a first set of configuration memory cells from each of the tiles, wherein the configuration memory cells store configuration data values used to program the first set of PIPs, wherein the first set of PIPs and the first set of configuration memory cells are organized to occupy a rectangular area within each of the tiles.

12. A set of field programmable gate arrays (FPGAs) that are programmable by compatible streams of configuration data values, the set comprising:

a first FPGA having an array of first tiles, wherein each of the first tiles includes;
    a first configurable logic element,
    a first configurable interconnect structure, and
    a first array of configuration memory cells arranged in rows and columns, wherein the first configurable logic element and the first configurable interconnect structure are configured in response to configuration data values stored in the first array, and a second FPGA having an array of second tiles, wherein each of the second tiles includes;
    a second configurable logic element that is substantially identical to the first configurable logic element;
    a second configurable interconnect structure, wherein the second configurable interconnect structure includes the first configurable interconnect structure and an additional configurable interconnect structure, and
    a second array of configuration memory cells arranged in rows and columns, wherein the second configurable logic element and the second configurable interconnect structure are configured in response to configuration data values stored in the second array, and wherein the second array includes a portion substantially identical to the first array plus additional configuration memory cells associated with the additional configurable interconnect structure.

13. The set of claim 12, wherein the additional configurable interconnect structure comprises a plurality of intermediate length lines.

14. The set of claim 12, wherein the first configurable logic element comprises a plurality of function generators and a corresponding plurality of registers coupled to the function generators.

15. The set of claim 12, wherein the second array comprises a first set of rows of configuration memory cells substantially identical to the first array, and a second set of rows of configuration memory cells that comprise the additional configuration memory cells.

16. The set of claim 12, wherein the additional configuration memory cells are located in dedicated rows of the second array.

17. A method of implementing an expandable tile for a field programmable gate array (FPGA), the method comprising the steps of:

providing a first configurable logic element and a first configurable interconnect structure;

configuring the first configurable logic element and the first configurable interconnect structure using a first set of configuration data values stored in a first array of configuration memory cells;

providing a second configurable interconnect structure for the first configurable logic element; and configuring the first configurable logic element and the second configurable interconnect structure using a second set of configuration data values stored in a second array of configuration memory cells, wherein a subset of the second array has an identical configuration to the first array.

* * * * *